(12) United States Patent
Kojima

(10) Patent No.: US 7,625,064 B2
(45) Date of Patent: Dec. 1, 2009

(54) LIQUID DROPLET EJECTION APPARATUS, METHOD FOR MANUFACTURING ELECTRO-OPTIC DEVICE, ELECTRO-OPTIC DEVICE, AND ELECTRONIC EQUIPMENT

(75) Inventor: Kenji Kojima, Suwa (JP)

(73) Assignee: Seiko Epson Corporation (JP)

( * ) Notice: Subject to any disclaimer, the term of this patent is extended or adjusted under 35 U.S.C. 154(b) by 393 days.

(21) Appl. No.: 11/221,227

(22) Filed: Sep. 7, 2005

(65) Prior Publication Data

US 2006/0050106 A1    Mar. 9, 2006

(30) Foreign Application Priority Data

Sep. 8, 2004    (JP)    ............... 2004-260997

(51) Int. Cl.
*B41J 23/00*    (2006.01)
*B41J 2/165*    (2006.01)

(52) U.S. Cl. .......................................... 347/37; 347/35
(58) Field of Classification Search ............... 347/22, 347/35–37, 19
See application file for complete search history.

(56) References Cited

U.S. PATENT DOCUMENTS

2003/0132980 A1* 7/2003 Yamazaki et al. ............. 347/19
2003/0227509 A1* 12/2003 Usuda ........................ 347/35
2004/0233265 A1* 11/2004 Kojima et al. ............... 347/102
2005/0045096 A1    3/2005 Kojima
2005/0253881 A1* 11/2005 Murayama et al. ............ 347/9

FOREIGN PATENT DOCUMENTS

| EP | 1462264 A1 | * | 9/2004 |
| JP | 2002140982 A | * | 5/2002 |
| JP | 2004-014393 | | 1/2004 |
| JP | 2004-098400 | | 4/2004 |
| JP | 2004-202325 | | 7/2004 |

* cited by examiner

*Primary Examiner*—Julian D Huffman
*Assistant Examiner*—Jason S Uhlenhake
(74) *Attorney, Agent, or Firm*—Harness, Dickey & Pierce, P.L.C.

(57) ABSTRACT

A liquid droplet ejection apparatus performs a drawing operation on a workpiece set on a set table by driving the ejection of a functional liquid droplet ejection head in a head unit while moving the head unit in a main scanning direction relative to the set table facing a drawing area by an X-axis table. The liquid droplet ejection apparatus includes a periodic flushing unit which is disposed on a main scan moving axis at a position offset from the drawing area towards the main scanning direction and which receives forcible ejection from the functional liquid droplet ejection head during non-drawing time and a pre-drawing flushing unit which is disposed adjacent to the set table and faces the drawing area and which receives forcible ejection from the functional liquid droplet ejection head performed immediately before starting the drawing operation.

9 Claims, 28 Drawing Sheets

F I G. 4
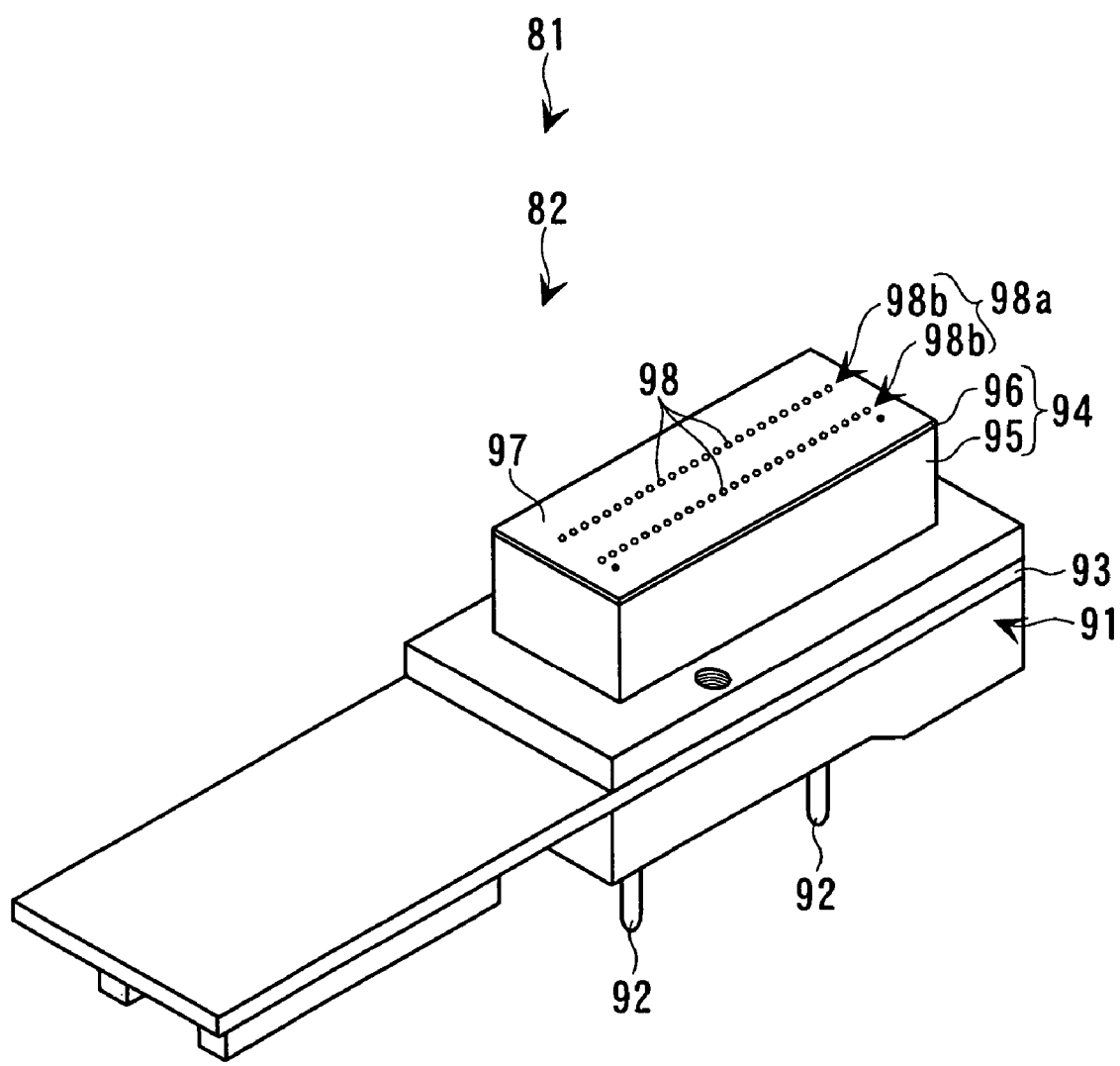

STRIPE

MOSAIC

DELTA

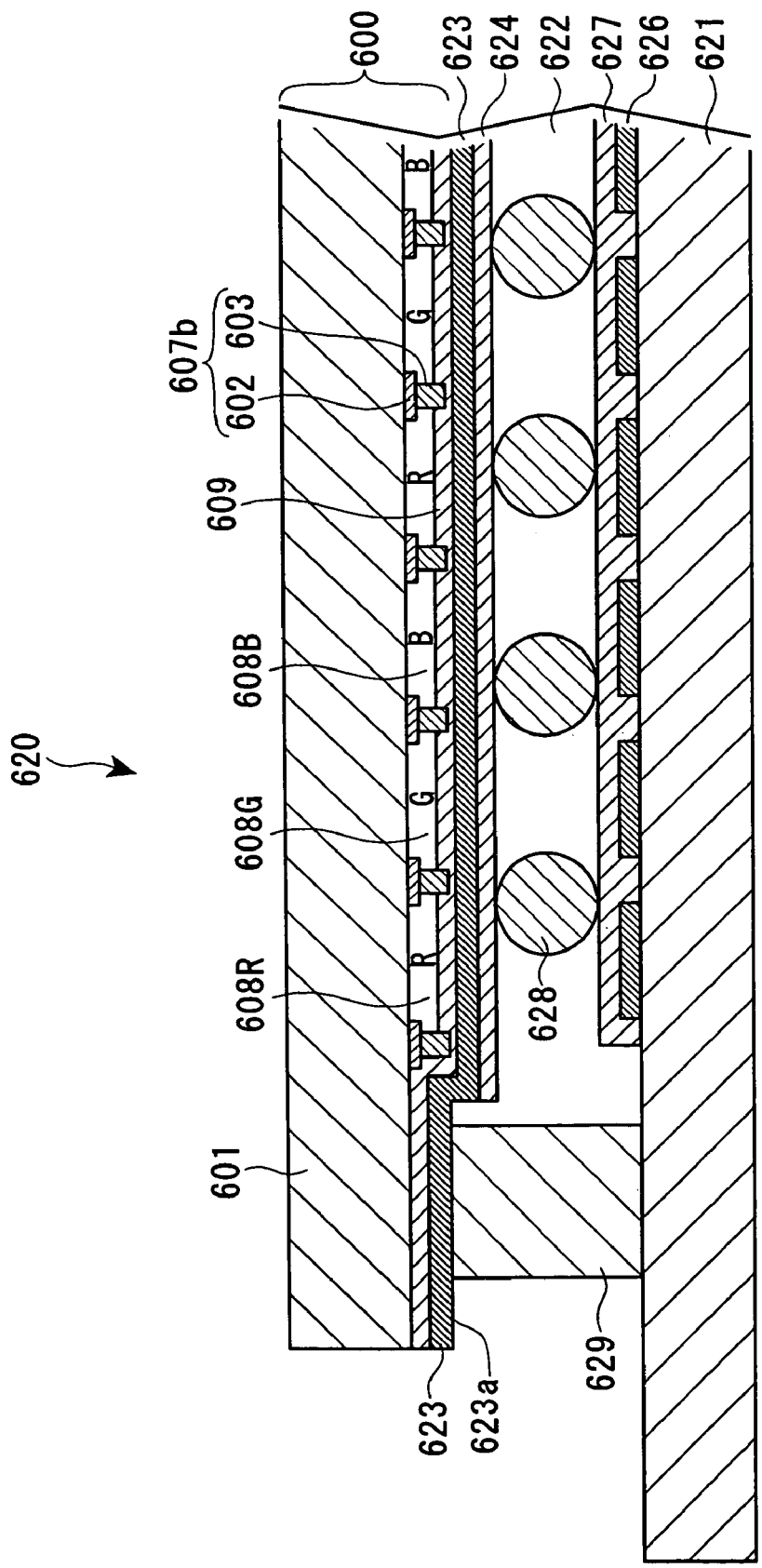

F I G. 1 5
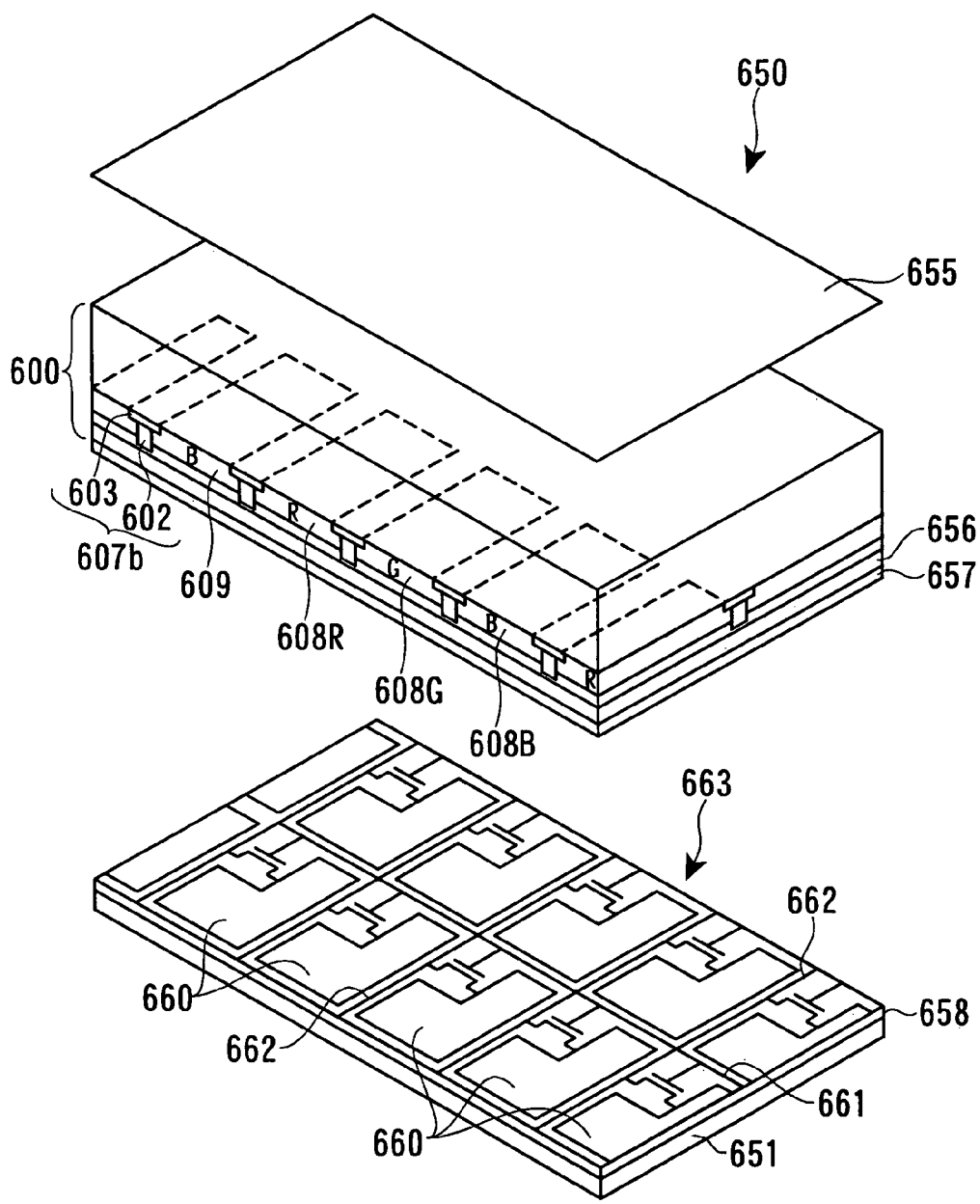

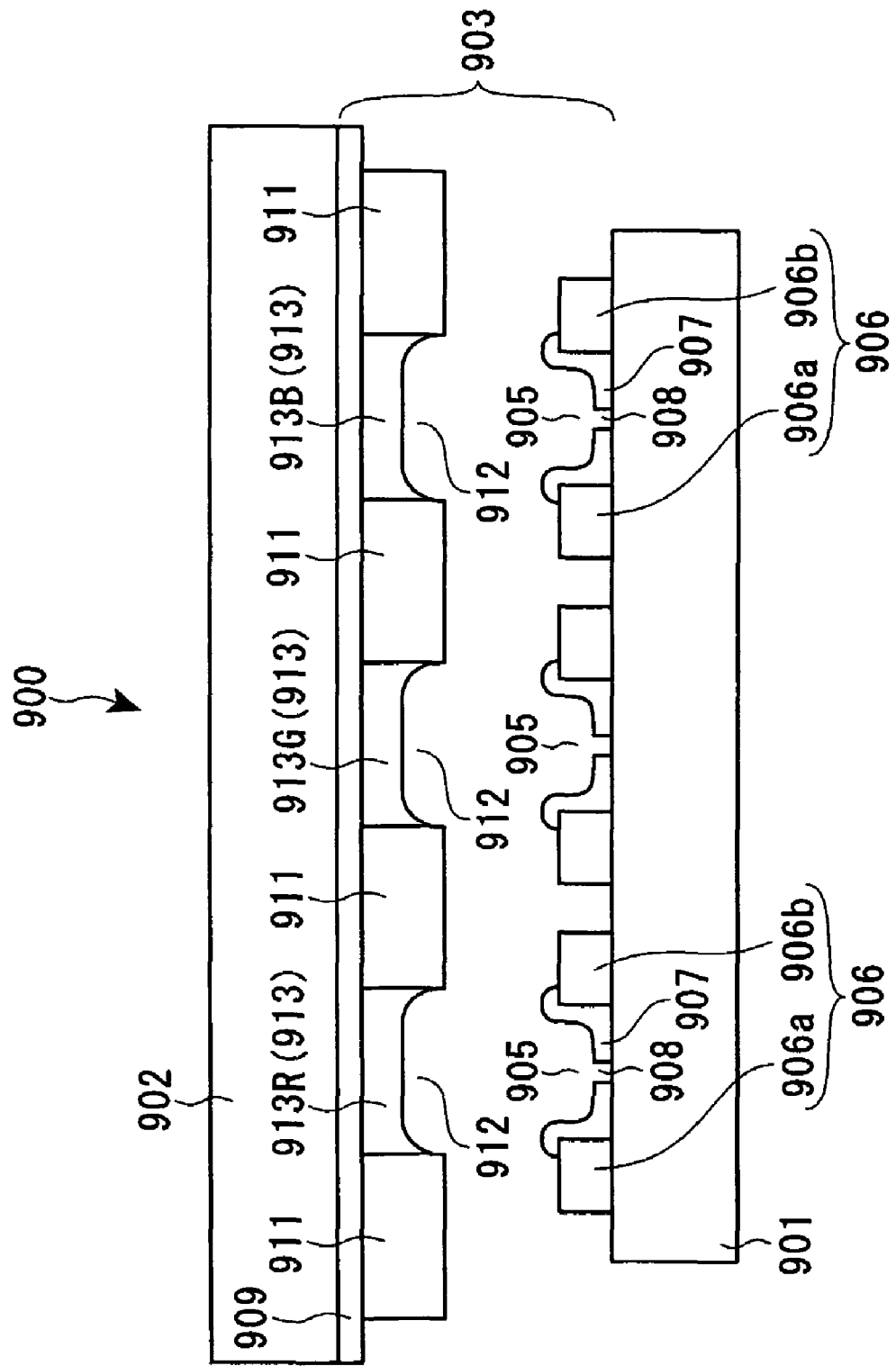

LIQUID DROPLET EJECTION APPARATUS, METHOD FOR MANUFACTURING ELECTRO-OPTIC DEVICE, ELECTRO-OPTIC DEVICE, AND ELECTRONIC EQUIPMENT

RELATED APPLICATIONS

This application claims priority to Japanese Patent Application No. 2004-260997 filed Sep. 8, 2004 which is hereby expressly incorporated by reference herein in its entirety.

BACKGROUND OF THE INVENTION

1. Field of the Invention

The present invention relates to a liquid droplet ejection apparatus that ejects functional liquid from a functional liquid droplet ejection head onto a workpiece while moving a head unit including the functional liquid droplet ejection head relative to the workpiece, a method for manufacturing an electro-optic device, an electro-optic apparatus, and an electronic equipment.

2. Description of the Related Art

There is known a liquid droplet ejection apparatus which is used to manufacture a variety of products (e.g., a color filter of a liquid crystal display device) by a liquid droplet ejection method using a functional liquid droplet ejection head. The liquid droplet ejection apparatus includes an X-axis direction moving mechanism which moves a substrate transport table (set table), on which a substrate (workpiece) is set, in the X-axis direction and an Y-axis direction moving mechanism which moves a head unit, on which the functional liquid droplet ejection head is mounted, in the Y-axis direction. The area where the moving area of the head unit and the moving area of the substrate transport table overlap is a liquid droplet ejection area where drawing (picturing) can be carried out on the substrate. By driving the ejection of the functional liquid droplet ejection head while relatively moving the head unit and the substrate, the liquid droplet ejection apparatus can draw a predetermined drawing pattern on the substrate located in the liquid droplet ejection area.

The liquid droplet ejection apparatus also includes a periodic flushing unit, which is one of maintenance units for maintaining the functional liquid droplet ejection head. A periodic flushing box receives forcible ejection (periodic flushing) from all ejection nozzles of the functional liquid droplet ejection head. The forcible ejection (or waste ejection) is carried out in order to prevent clogging of the functional liquid droplet ejection head while no drawing process is carried out to the workpiece and in order to stabilize the amount of functional liquid ejected from the functional liquid droplet ejection head. Accordingly, the periodic flushing box includes a liquid reservoir for receiving the functional liquid of the forcible ejection. The liquid reservoir is located in the moving area of the head unit moved by the Y-axis direction moving mechanism and outside the moving area of the substrate transport table. When carrying out the periodic flushing ejection, the head unit is moved to a position immediately above the liquid reservoir (see, for example, JP-A-2004-202325).

Since the ejection nozzle of the functional liquid droplet ejection head is very small, even a short stop of an ejection mechanism may cause clogging of the ejection nozzle or may cause the variation in the amount of ejected functional liquid. Accordingly, it is desirable that the nonoperating time of the functional liquid-droplet ejection head is reduced as much as possible by repeatedly ejecting the functional liquid from the functional liquid droplet ejection head even when the drawing process is not carried out on the workpiece. However, in the known liquid droplet ejection apparatuses, since a liquid reservoir of the periodic flushing unit is located outside the moving area of the substrate transport table, the Y-axis direction moving mechanism needs to move the head unit located in a liquid droplet ejection area to the liquid reservoir of the periodic flushing unit when carrying out periodic flushing after a drawing process. In addition, when carrying out another drawing process, the Y-axis direction moving mechanism needs to move the head unit to the liquid droplet ejection area again. Therefore, the known liquid droplet ejection apparatus requires a long time from the completion of the drawing process to the start of the periodic flushing process and from the completion of the periodic flushing process to the start of another drawing process. That is, since the stop time of the ejection of the functional liquid droplet ejection head increases, an ejection defect of the functional liquid droplet ejection head tends to occur. Furthermore, the round-trip time of the head unit moving between the liquid droplet ejection area and the liquid reservoir for each drawing process increases the tact time of total processing, thus decreasing the processing efficiency.

SUMMARY OF THE INVENTION

Accordingly, it is an advantage of the invention to provide a liquid droplet ejection apparatus, a method for manufacturing an electro-optic device, an electro-optic device, and an electronic equipment for reducing an ejection defect of a functional liquid droplet ejection head by reducing the stop time of the ejection of the functional liquid droplet ejection head and the tact time of the process.

According to one aspect of the invention, there is provided a liquid droplet ejection apparatus for performing a drawing operation on a workpiece set on a set table by driving the ejection of a functional liquid droplet ejection head mounted in a head unit. The functional liquid droplet ejection head includes a plurality of ejection nozzles and the head unit is moved in a drawing area in a main scanning direction relative to the set table located in the drawing area by main scan moving means. The apparatus comprises: a periodic flushing unit disposed on a main scan moving axis offset from the drawing area towards the main scanning direction, the periodic flushing unit receiving forcible ejection from all of the ejection nozzles of the functional liquid droplet ejection head during non-drawing time; and a pre-drawing flushing unit disposed adjacent to the set table, the pre-drawing flushing unit facing the drawing area, the pre-drawing flushing unit receiving forcible ejection from all of the ejection nozzles of the functional liquid droplet ejection head, the forcible ejection being performed immediately before starting the drawing operation on the workpiece.

According to this arrangement, since the periodic flushing unit is disposed on a main scan moving axis shifted from the drawing area towards the main scanning direction, the apparatus allows the head unit to face the periodic flushing unit by using a moving axis of the head unit (i.e., the main scan moving means). Consequently, the head unit can efficiently use a relative movement of the head unit in the main scanning direction for drawing on the workpiece in order to face the periodic flushing unit, and therefore, the time required for the head unit to move between the drawing area and the periodic flushing unit can be reduced. As a result, the stop time of the functional liquid droplet ejection head due to the movement of the head unit can be reduced, thus maintaining the functional liquid droplet ejection head in good ejection conditions.

When the head unit moves from the periodic flushing unit to the drawing area, the ejection of the functional liquid droplet ejection head stops for only a short time. However, since the pre-drawing flushing unit is disposed adjacent to the set table for holding the workpiece, the forcible ejection can be performed immediately before the start of the drawing operation on the workpiece. Thus, the functional liquid droplet ejection head can be in stable ejection conditions before the drawing operation on the workpiece. As a result, the drawing operation can be precisely performed.

In this case, the main scan moving means preferably supports the set table, the periodic flushing unit, and the pre-drawing flushing unit and moves these components in the main scanning direction relative to the head unit.

According to this arrangement, by moving the set table, the periodic flushing unit, and the pre-drawing flushing unit in the main scanning direction, these components can face the head unit.

In this case, the main scan moving means preferably includes and supports a slider movably in the main scanning direction. The periodic flushing unit and the set table are preferably supported by the slider. The pre-drawing flushing unit is preferably supported by the set table.

According to this arrangement, since the periodic flushing unit is supported by the slider that supports the set table, the forward and backward operation of the slider in the main scanning direction moves the periodic flushing unit forward and backward in the main scanning direction along with the slider. Accordingly, when the periodic flushing unit carries out forcible ejection (periodic flushing), the periodic flushing unit can face the head unit using the movement of the set table in the main scanning direction. Additionally, since the pre-drawing flushing unit is supported by the set table, the forward and backward operation of the slider in the main scanning direction moves the pre-drawing flushing unit along with the slider so that the pre-drawing flushing unit can face the head unit.

In this case, the main scan moving means preferably includes a first slider for supporting the set table movably in the main scanning direction and a second slider independently controlled from the first slider for supporting the periodic flushing unit movably in the main scanning direction, and the pre-drawing flushing unit is preferably supported by the set table.

According to this arrangement, since the set table and the periodic flushing unit are respectively supported by two independently controlled sliders, the load for moving each slider can be reduced. Additionally, the set table can be moved along with the periodic flushing unit or can be moved separately from the periodic flushing unit. Since the pre-drawing flushing unit is supported by the set table, the forward and backward operation of the first slider in the main scanning direction moves the pre-drawing flushing unit along with the first slider so that the pre-drawing flushing unit can face the head unit.

Preferably, the liquid droplet ejection apparatus further includes control means for controlling the functional liquid droplet ejection head and the main scan moving means. In this liquid droplet ejection apparatus, the periodic flushing unit moves to a flushing position where the periodic flushing unit faces the head unit when the set table moves to a workpiece exchange position, and the control means causes the periodic flushing unit to perform the forcible ejection during an operation for mounting and dismounting the workpiece.

According to this arrangement, when the set table moves to the workpiece exchange position, the periodic flushing unit faces the head unit. During the workpiece mounting and dismounting operation, the periodic flushing is performed. Thus, the occurrence of an ejection defect of the functional liquid droplet ejection head can be reliably prevented during the workpiece mounting and dismounting operation.

Preferably, in this case, the drawing operation is performed by the main scanning operation that drives the ejection of the functional liquid droplet ejection head while moving the set table in the drawing area in the main scanning direction and a sub scanning operation that moves the functional liquid droplet ejection head in a sub scanning direction, and the length of the pre-drawing flushing unit in the sub scanning direction corresponds to a moving trajectory of the head unit in the sub scan operation.

According to this arrangement, since the length of the pre-drawing flushing unit in the sub scanning direction corresponds to a moving trajectory of the head unit in the sub scan operation, the pre-drawing flushing unit can receive the functional liquid of the pre-drawing flushing operation even when the head unit is located at any position in the sub scanning direction.

Preferably, in this case, the length of the periodic flushing unit in the sub scanning direction corresponds to a moving trajectory of the head unit in the sub scan operation.

According to this arrangement, even when the head unit is located at any position in the sub scanning direction, all of the functional liquid droplet ejection heads can perform the periodic flushing operation at the same time and the periodic flushing box can reliably receive the ejected functional liquid. Accordingly, when the drawing operation starts from a predetermined home position, the periodic flushing operation can be performed while the head unit is moving from its position at the drawing operation termination time to the home position for the next drawing operation. Additionally, the periodic flushing operation can be performed even when the next drawing operation starts from the position of the head unit at the previous drawing termination time and the head unit is located at any position.

Preferably, in this case, the liquid droplet ejection apparatus further includes an ejection defect test unit for detecting an ejection defect of the functional liquid droplet ejection head by recognizing an image of a test pattern written by causing all of the ejection nozzles of the functional liquid droplet ejection head to perform test ejection onto a drawn unit, and the drawn unit is disposed at a position offset from the drawing area towards the main scanning direction and located on the main scan moving axis between the drawing area and the periodic flushing unit.

According to this arrangement, since the drawn unit of the ejection defect test unit is disposed between the drawing area and the periodic flushing unit, the drawn unit can face the head unit to draw the test pattern while the head unit is relatively moving between the drawing area and the periodic flushing unit. That is, the head unit need not relatively move in order to draw only the test pattern. By using the relative movement of the head between the drawing area and the periodic flushing unit, the test pattern can be efficiently drawn.

According to another aspect of the invention, there is provided a method for manufacturing an electro-optic device comprising forming a coating portion on a workpiece with functional liquid droplets by using the above-described liquid droplet ejection apparatus. Furthermore, according to still another aspect of the invention, there is provided an electro-optic device comprising a coating portion formed on a workpiece with functional liquid droplets by using the above-described liquid droplet ejection apparatus.

According to this arrangement, since the above-described liquid droplet ejection apparatus that reduces the occurrence of the clogging of the functional liquid droplet ejection head and that provides stable ejection of functional liquid is employed, the coating portion can be precisely formed, and therefore, the electro-optic device can be efficiently manufactured. Examples of the electro-optic devices include a liquid crystal display device, an organic electroluminescent (EL) device, an electron emission device, a plasma display panel (PDP) device, and an electrophoretic display device. The electron emission device refers to a device such as a field emission display (FED) and a surface-conduction electron-emitter display (SED). In addition, the electro-optic devices is a concept including devices for forming metal wiring, a lens, a resist, a light diffuser, or the like.

According to another aspect of this invention, there is provided an electronic equipment comprising one of an electro-optic device manufactured by using the above-described method and the above-described electro-optic device.

In this case, the electronic equipment corresponds to a cell phone, a personal computer, or a variety of electric products having mounted thereon a flat panel display.

BRIEF DESCRIPTION OF THE DRAWINGS

FIG. 4 is an external perspective view of a functional liquid droplet ejection head;

FIG. 7A illustrates a stripe arrangement, FIG. 7B illustrates a mosaic arrangement, and FIG. 7C illustrates a delta arrangement;

FIG. 8A is a schematic plan view illustrating a first drawing operation, FIG. 8B is a schematic plan view illustrating a second drawing operation, and FIG. 8C is a schematic plan view illustrating a third drawing operation;

FIG. 13 is a cross-sectional view of an essential part of the structure of a liquid crystal device including a color filter according to an embodiment of the invention;

FIG. 15 is a cross-sectional view of an essential part of a third example of the liquid crystal device including a color filter according to an embodiment of the invention;

FIG. 27 is a cross-sectional view of an essential part of an electron emission device (FED device)

DESCRIPTION OF THE PREFERRED EMBODIMENTS

A liquid droplet ejection apparatus according to the invention is described below with reference to the accompanying drawings. The liquid droplet ejection apparatus is used in a manufacturing line of a flat display. By adopting the liquid droplet ejection method using a functional liquid droplet ejection head, the liquid droplet ejection apparatus is used to manufacture a color filter of a liquid crystal display device for three colors, namely, red (R), green (G), and blue (B), or light emitting elements functioning as pixels of an organic electroluminescent (EL) display on a workpiece (substrate).

Figure 1:
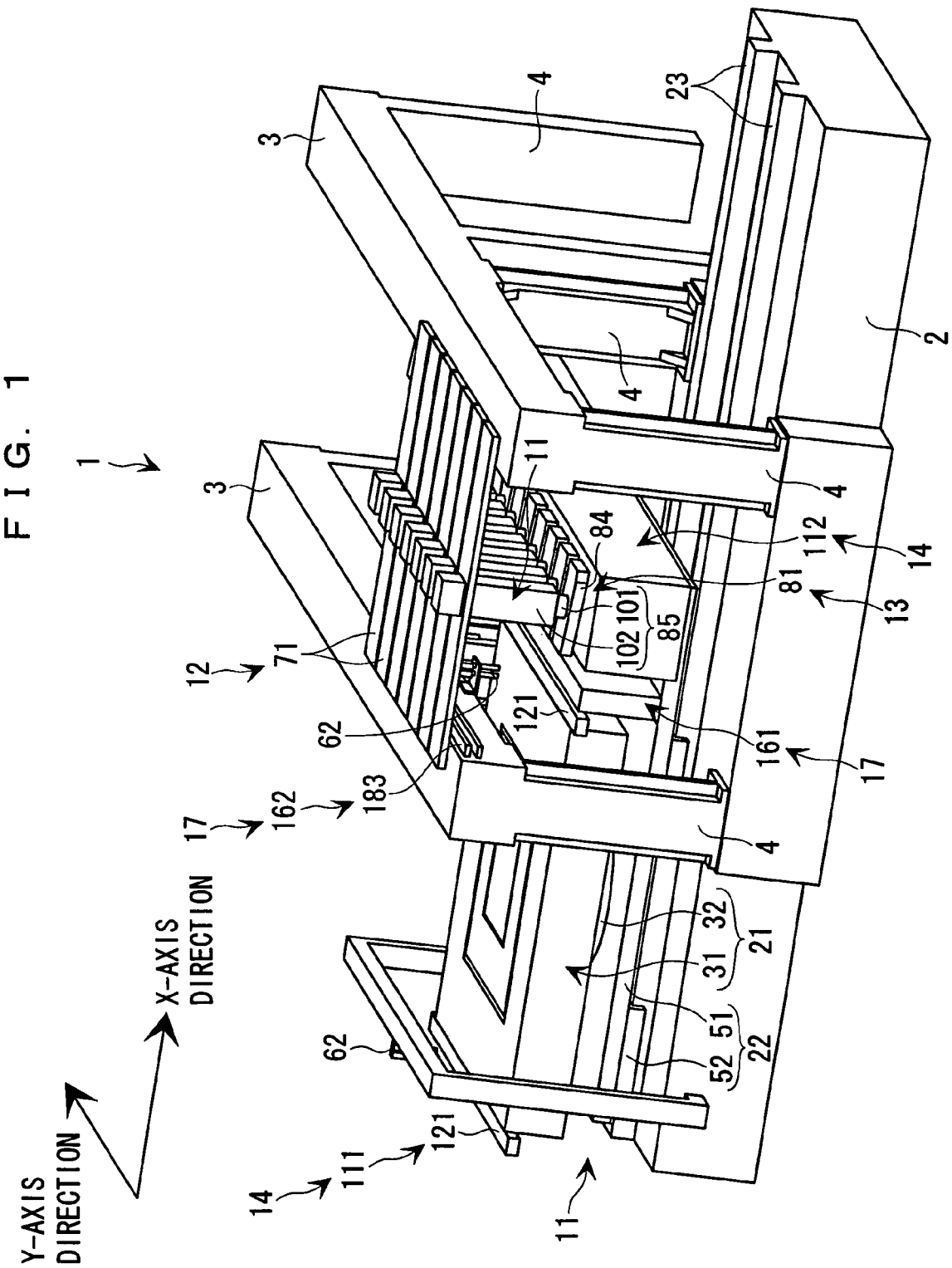
FIG. 1 is an external perspective view of a liquid droplet ejection apparatus according to an embodiment of the invention when a set table (suction table) is located at a workpiece exchange position.
Figure 2:
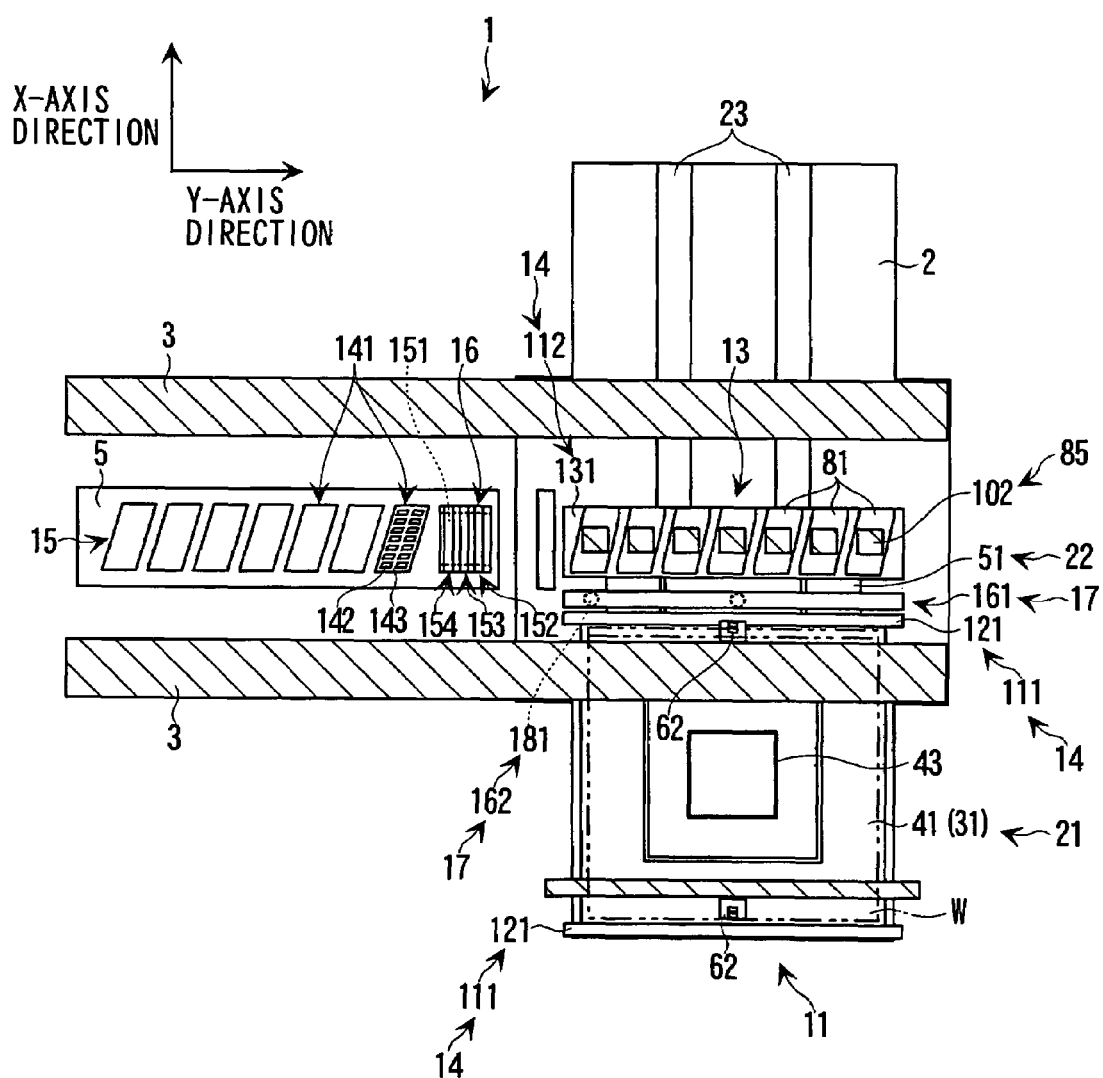
FIG. 2 is a plan view of the liquid droplet ejection apparatus when the set table (suction table) is located at the workpiece exchange position and a bridge plate is removed.
Figure 3:
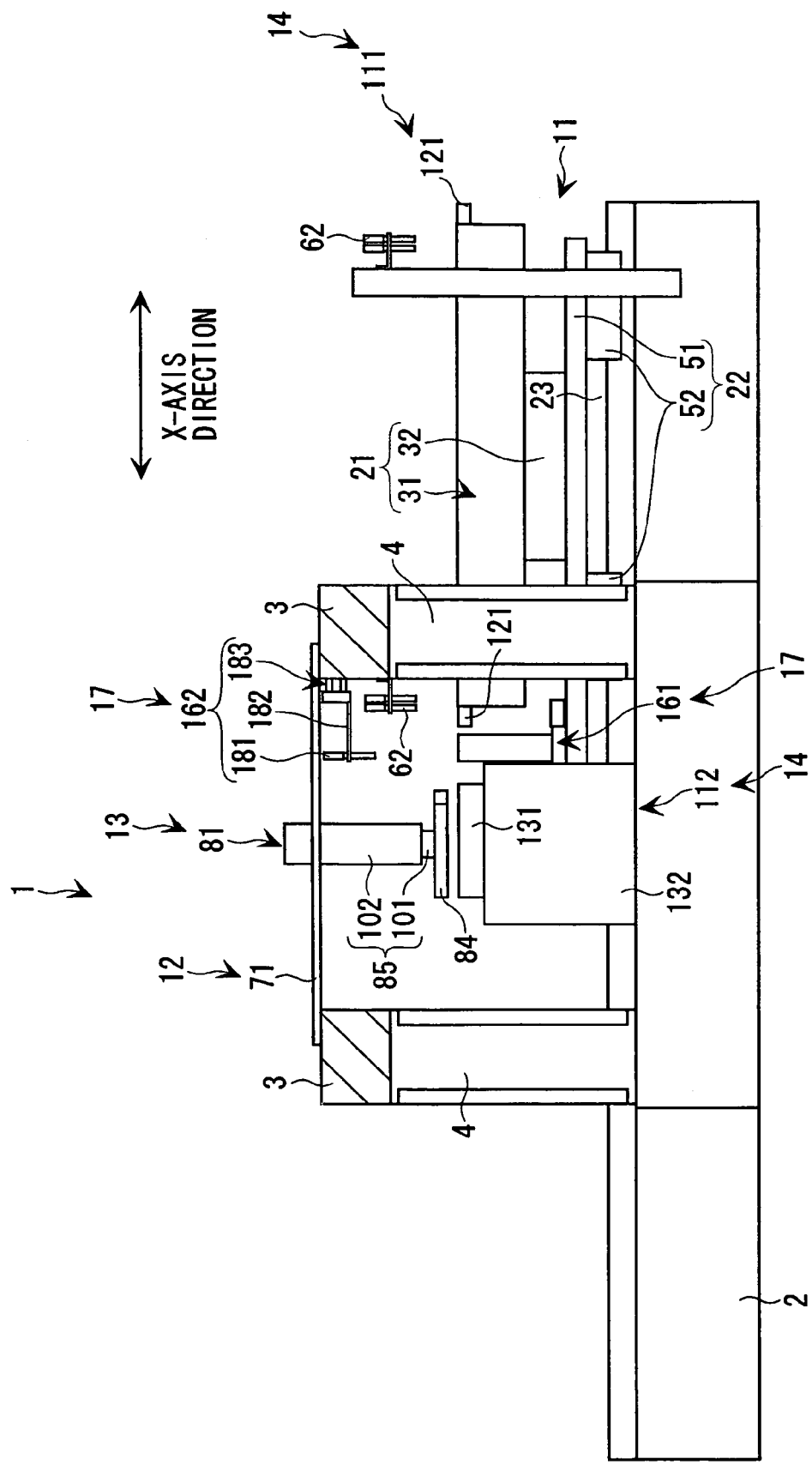
FIG. 3 is a side view of the liquid droplet ejection apparatus when the set table (suction table) is located at the workpiece exchange position.

As shown in FIGS. 1 through 3, a liquid droplet ejection apparatus 1 is installed on an X-axis support base 2 (stone bed). The liquid droplet ejection apparatus 1 includes an X-axis table 11 (main scan moving means) which extends in the X-axis direction (main scanning direction) and which moves a workpiece W in the X-axis direction; a Y-axis table 12 (sub scan moving means) mounted on two Y-axis support bases 3, which bridge over the X-axis table 11 by a plurality of support rods, while extending in the Y-axis direction (sub scanning direction); and a head unit 13 which includes seven carriage units 81 on which a plurality of functional liquid droplet ejection heads 82 (not shown) are mounted and which is movably supported by the Y-axis table 12 in the Y-axis direction (sub scanning direction). The liquid droplet ejection apparatus 1 controls the ejection of the functional liquid droplet ejection head 82 in synchronization with the drive of the X-axis table 11 and the Y-axis table 12 so that the functional liquid droplet ejection head 82 ejects functional liquid droplets for R, G, and B colors to draw a predetermined drawing pattern on the workpiece W (a drawing process).

The liquid droplet ejection apparatus 1 further includes a flushing unit 14, a suction unit 15, a wiping unit 16, an ejection-defect test unit 17 (hereinafter collectively referred to as maintenance means). These units are used for maintaining the functional liquid droplet ejection head 82.so that the function of the functional liquid droplet ejection head 82 is maintained or recovered (a maintenance process). Among these units serving as the maintenance means, the flushing unit 14 and the ejection-defect test unit 17 are mounted on the X-axis table 11 whereas the suction unit 15 and the wiping unit 16 are arranged on a platform 5 located at a position which is away from the X-axis table 11 and to which the Y-axis table 12 can move the head unit 13.

The liquid droplet ejection apparatus 1 includes control means 18 for carrying out overall control of the apparatus (not shown). The above-described drawing process and maintenance process are carried out under the control of the control means 18.

The components of the liquid droplet ejection apparatus 1 are described next. As shown in FIGS. 1 through 3, the X-axis table 11 includes a set table 21 on-which the workpiece W is set, an X-axis air slider 22 for slidably supporting the set table 21 in the X-axis direction, left and right X-axis linear motors (not shown) which extend in the X-axis direction and which move the workpiece W in the X-axis direction via the set table 21, and a pair of (two) X-axis guide rails 23 which extend along the X-axis linear motors and guide the movement of the X-axis air slider 22.

Figure 9:
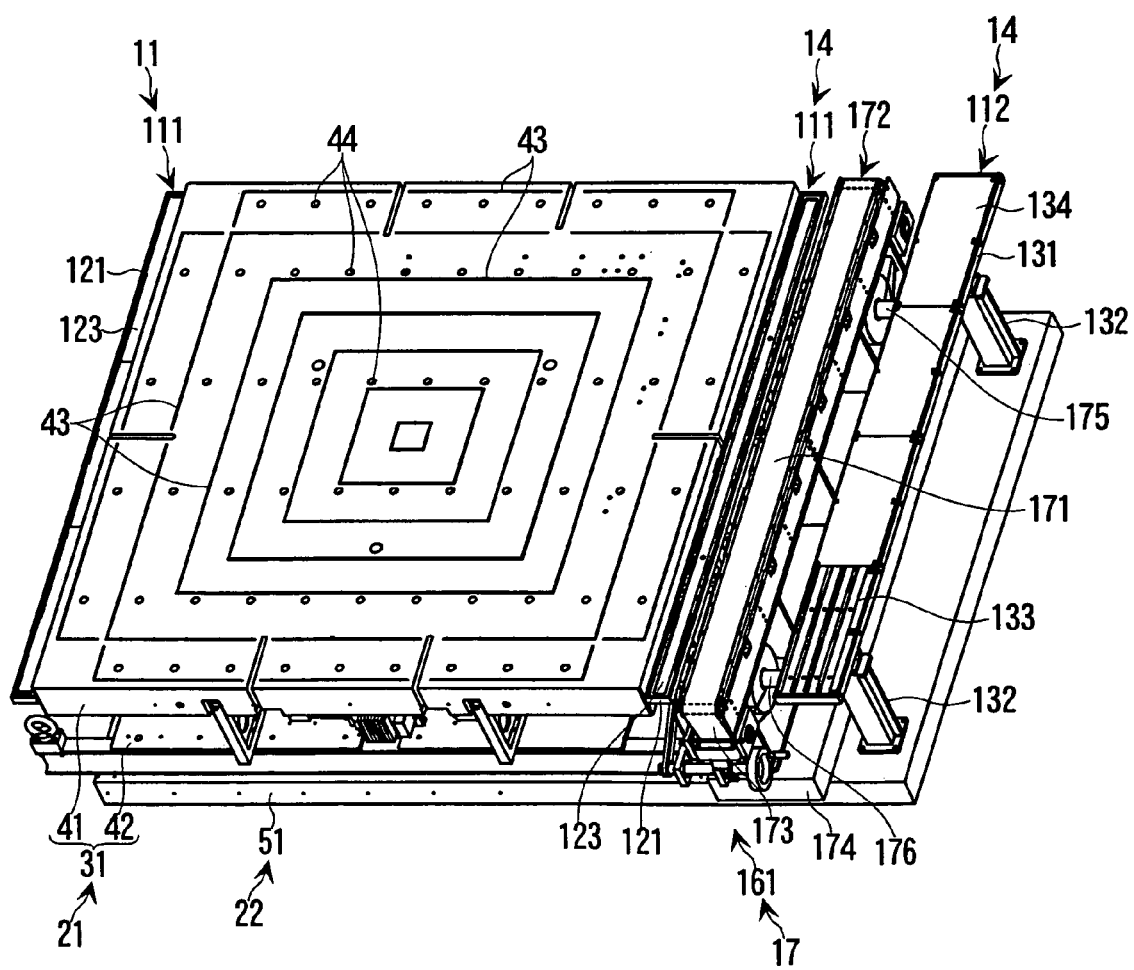
FIG. 9 is an external perspective view of an X-axis air slider and its vicinity.

The set table 21 includes a suction table 31 for sucking and setting the workpiece W and a θ table 32 for supporting the suction table 31 and correcting the position of the workpiece W set on the suction table 31 in the θ-axis direction. As shown in FIG. 9, the suction table 31 includes a table body 41 for sucking and setting the workpiece W, three sets of table supporting members (not shown) for supporting the table body 41 at three points, and a support base 42 which i's fixed to the θ table 32 and which supports the table body 41 via the table supporting members. The table body 41 is composed of a thick stone plate and is substantially square having sides of 1800 mm in plan view. A plurality of suction guide grooves 43 are formed on the surface of the table body 41 to suck the workpiece W. An air drawing port (not shown) is formed in each of the suction guide grooves 43 while passing through it to communicate with the air drawing means. Thus, a sufficient suction force can be applied to the workpiece W through the suction guide grooves 43.

The support base 42 supports a pre-drawing flushing unit 111, which is described below, as well as the three sets of table supporting members. A pre-drawing flushing box 121 of the pre-drawing flushing unit 111, which is described below, is attached to each side of the table body 41 parallel to the Y-axis. A plurality of lifter pins (not shown) of a lifter mechanism (not shown) are loosely inserted into a plurality of loose insertion holes 44. The suction table 31 incorporates a lifter mechanism for providing a workpiece to the suction table 31 or removing the workpiece from the suction table 31. The lifter mechanism is supported by the support base 42 and has the plurality of lifter pins which can freely move up and down. By protruding the plurality of lifter pins from the plurality of loose insertion holes 44 formed in the table body 41, the lifter mechanism receives an unprocessed workpiece W from a robot arm (not shown) and transfers it to the suction table 31. The lifter mechanism also lifts a processed workpiece W off the set table 21 and transfers it to the robot arm.

As shown in FIGS. 1 and 3, the X-axis air slider 22 includes a slider body 51 for supporting the set table 21 (θ table 32) and two pairs of engaging portions 52 (i.e., four engaging portions) secured to the lower portion of the slider body 51 and engaged with the pair of X-axis guide rails 23. As well as the set table 21, the slider body 51 includes a periodic flushing unit 112 of the flushing unit 14 and a drawn unit 161 of the ejection-defect test unit 17, both of which are described below. When the pair of the X-axis linear motors is synchronously activated, the X-axis air slider 22 moves in the X-axis direction while the pair of the engaging portions 52 is guided by the pair of the X-axis guide rails 23 so that the workpiece W set on the set table 21 moves in the X-axis direction (main scanning movement).

At the bottom of FIG. 2 is a workpiece exchange position 61 where the workpiece W is to be mounted or dismounted. When an unprocessed workpiece W is mounted on the suction table 31 or a processed workpiece W is collected, the suction table 31 is moved to that position. Workpiece alignment cameras 62 shown in FIG. 2 recognize the position of the workpiece W. The θ table 32 performs θ correction of the workpiece W on the basis of an image captured by the workpiece alignment cameras. 62.

The Y-axis table 12 includes seven bridge plates 71, each of which allows the carriage unit 81 (a carriage 85) of the head unit 13 to pass through and securely holds it; seven pairs of (fourteen) Y-axis sliders (not shown) which support the seven bridge plates 71 at the both ends thereof; a pair of Y-axis linear motors (not shown) which is mounted on the pair of Y-axis support bases 3 and which moves the bridge plates 71 in the Y-axis direction via the seven pairs of (fourteen) Y-axis sliders; and a pair of Y-axis guide rails (not shown) which is mounted on the Y-axis support bases 3 parallel to the Y-axis linear motors and which supports the seven pairs of (fourteen) Y-axis sliders to guide the movement of each Y-axis slider.

When the pair of the Y-axis linear motors is synchronously driven, each Y-axis slider is guided by the pair of Y-axis guide rails and translates in the Y-axis direction. Thus, the bridge plates 71 move while the both ends thereof are supported. Along with the bridge plates 71, the carriage unit 81 moves in the Y-axis direction (sub scan movement). In this case, by controlling the drive of the Y-axis linear motors, the bridge plates 71 (carriage units 81) can be independently moved. Alternatively, the seven bridge plates 71 can be moved as one body.

As shown in FIGS. 1 through 3, the head unit 13 includes the seven carriage units 81 having the same structure arranged in the Y-axis direction. Each of the carriage units 81 includes twelve functional liquid droplet ejection head 82 (not shown), six head holding plates 83 (not shown) each of which holds two functional liquid droplet ejection head 82, a head plate 84 having the twelve functional liquid droplet ejection head 82 via the six head holding plates 83, and the carriage 85 for supporting the head plate 84.

As shown in FIG. 4, the functional liquid droplet ejection head 82 has a twin structure. The functional liquid droplet ejection head 82 includes a functional liquid introducing unit 91 having a twin connection pin 92, a twin-head substrate 93 connected to the functional liquid introducing unit 91, and a head body 94 including an in-head flow channel which communicates with the bottom of the functional liquid introducing unit 91 and which is filled with functional fluid. The connection pins 92 are connected to a functional liquid tank (not shown) and supply the functional liquid introducing unit 91 with the functional fluid. The head body 94 includes a cavity 95 (piezoelectric device) and a nozzle plate 96 having a nozzle surface 97 on which openings of a plurality of ejection nozzles 98 are formed. When the ejection of the functional liquid droplet ejection head 82 is activated, a voltage is applied to the piezoelectric device and the cavity 95 functions as a pump. As a result, functional liquid droplets are ejected from the ejection nozzles 98.

The plurality of the ejection nozzles 98 formed on the nozzle surface 97 are arranged at an even pitch (2 dots per pitch) and form two separated nozzle lines 98b, each of which includes 180 ejection nozzles 98. The two separated nozzle lines 98b are shifted to each other by one dot pitch. That is, the functional liquid droplet ejection head 82 provides a nozzle line 98a having one dot pitch formed by the two separated nozzle lines 98b. Thus, the high-resolution drawing (one dot pitch) can be provided.

Each of the six head holding plates 83 is composed of, for example, a thick stainless plate and has a rectangular shape in plan view. Two mounting openings (not shown) for respectively positioning and mounting the two functional liquid droplet ejection heads 82 are formed on the head holding plates 83 in the length direction thereof. The two mounting openings have a nozzle line pitch for six heads.

Figure 5:
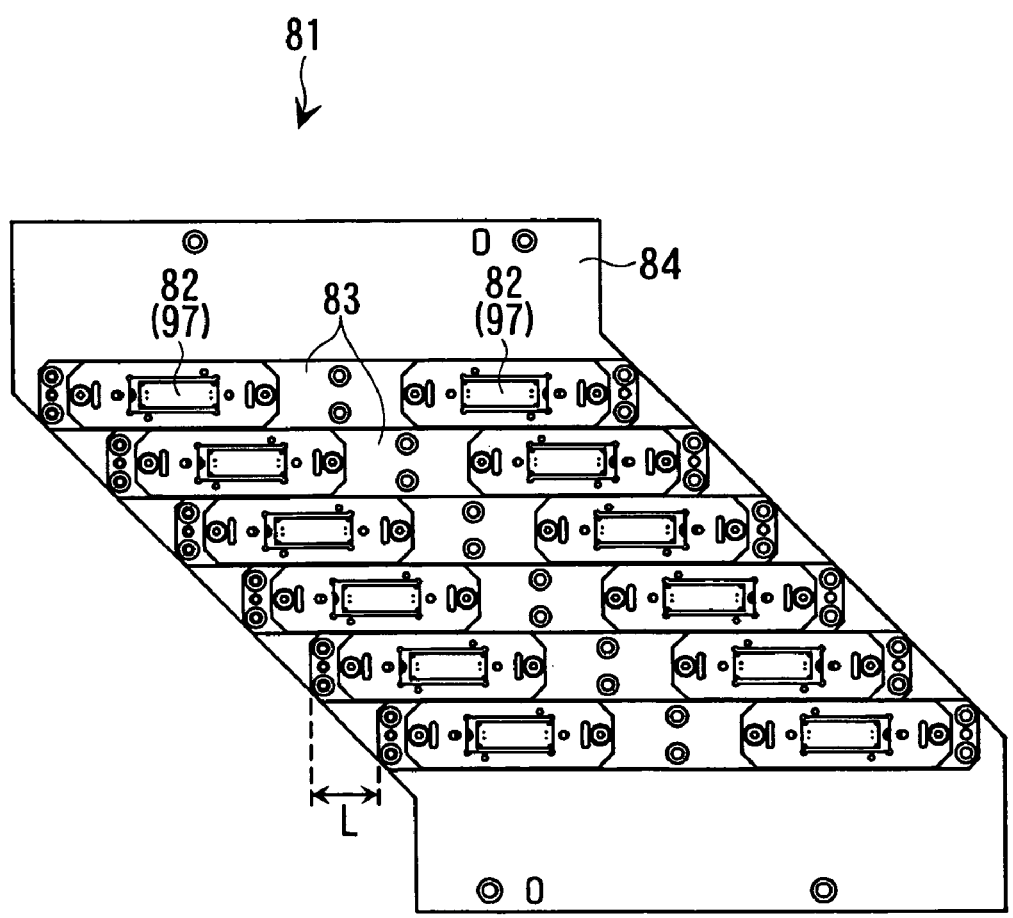
FIG. 5 is a plan view of a head plate viewed from the bottom of a carriage unit and illustrates the vicinity of the head plate.

As shown in FIG. 5, the head plate 84 is composed of, for example, a thick stainless plate and appears to be substantially parallelogram-shaped when viewed in top plan. Two mounting openings (not shown) for positioning and mounting the head holding plates 83 are formed on the head plate 84. Six head holding plates 83 are arranged in a staircase pattern while being shifted to each other by a nozzle line length L for about one head (in a direction of the nozzle line of the functional liquid droplet ejection head 82). Thus, the nozzle line 98a of twelve functional liquid droplet ejection heads 82 mounted on each of the head plates 84 forms a line in the Y-axis direction (partly overlapped). As a result, a single divided drawing line is formed.

The carriage 85 includes a θ rotation mechanism 101 for rotatably supporting the head plate 84 by θ correction (θ rotation) and a hanging member 102 for allowing the Y-axis table 12 (each of the bridge plates 71) to support the head plate 84 via the θ rotation mechanism 101. The θ rotation mechanism 101 supports the head plate 84 so that the divided drawing line is parallel to the Y-axis direction. Although not shown, the hanging member 102 incorporates a head elevation mechanism (not shown) for lifting the head plate 84 via the θ rotation mechanism 101 so that the height level of the head plate 84 (the nozzle surface 97 of the functional liquid droplet ejection head 82) can be adjusted.

The seven carriages 85 are supported by the seven bridge plates 71, respectively, and the seven carriage units 81 are aligned in the Y-axis direction. Thus, the head unit 13 is formed. In the head unit 13, 12×7 functional liquid droplet ejection heads 82 are continuously arranged in the Y-axis direction and seven divided drawing lines of the carriage units 81 are connected in the Y-axis direction to form one drawing line. The left side position of the X-axis table 11 in FIG. 2 (the platform 5 side) is the home position of the head unit 13. The drawing process on the workpiece W starts from this position.

Figure 6:
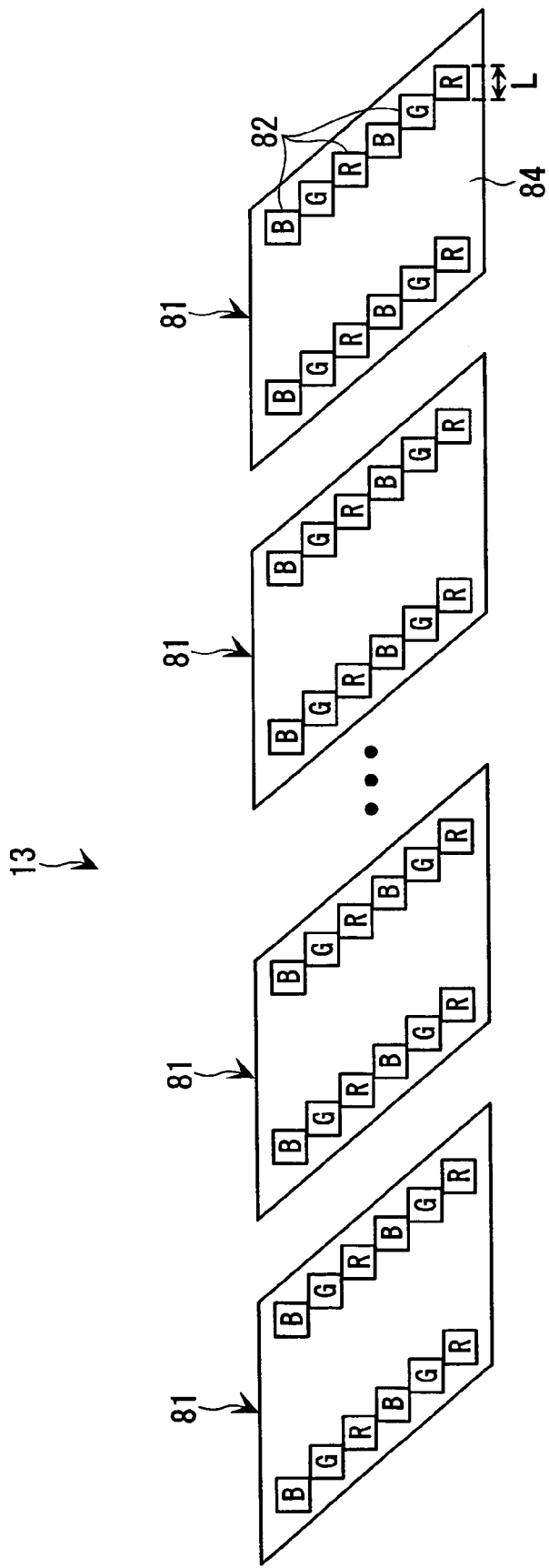
FIG. 6 illustrates color patterns of a functional liquid droplet ejection head mounted in a head unit.

Each of the 12×7 functional liquid droplet ejection heads 82 mounted on the head unit 13 corresponds to functional liquid of either R, G, or B color so that a drawing pattern formed from functional liquid of three colors can be written on the workpiece W. FIG. 6 illustrates a color pattern of the functional liquid droplet ejection heads 82 of the head unit 13 according to this embodiment. As shown in FIG. 6, in the color pattern of the functional liquid droplet ejection heads 82 of the head unit 13, three colors, namely, R, G, and B colors are repeatedly assigned to the 12×7 functional liquid droplet ejection heads 82 in a predetermined order (R, G, and B from the right of FIG. 6 in this embodiment). The color pattern of the functional liquid droplet ejection heads 82 for each of the seven carriage units 81 is identical to each other.

Accordingly, by moving the head unit 13 in the sub scanning direction by a nozzle line length for two heads, the functional liquid droplet ejection heads 82 for R, G, and B colors can face the area which the third and later functional liquid droplet ejection heads 82 previously faced. Thus, a drawing pattern of three colors can be written in this area. Therefore, in this embodiment, the length of a drawing line is determined so that the sub scan movement for two-head nozzle line length can complete a drawing process for one workpiece W. More specifically, the drawing line length is determined on the basis of the maximum width of the workpiece W that can be set on the set table 21. That is, the drawing line length is determined to be a nozzle line length (i.e., the minimum value for n heads) that allows drawing for the workpiece W having the maximum width by one main scan movement plus the nozzle line length for two heads (i.e., (n+2)×L). In this embodiment, n=82.

Additionally, since the number of the head holding plates 83 in the head plate 84 (i.e., 6) is an integer multiple of the number of colors (i.e., 3), functional liquid of one color corresponds to two functional liquid droplet ejection heads 82 held by one head holding plate 83. Thus, the pipe arrangement between the functional liquid tank and each of the functional liquid droplet ejection heads 82 can be simplified.

A series of drawing processes of the liquid droplet ejection apparatus 1 is described next with reference to FIG. 8 when a color filter of a liquid crystal display device is produced. The processes are briefly described here, although the detailed description is provided later. A color filter 600 includes a transparent substrate 601, a plurality of pixel areas (filter elements) 607a arranged in a matrix in the X-axis and Y-axis directions on the workpiece W, coloring layers 608 for R, G, and B colors (608R, 608G, and 608B) formed on each pixel area 607a, and a light-shielding bank 603 for separating the pixel areas 607a (see FIGS. 8 and 12). In a drawing process, a substrate 603 which has already had the bank 603 is used as the workpiece W. A predetermined drawing pattern is written on the workpiece W such that functional liquid of one of R, G, and B colors is ejected onto each pixel area 607a.

Figure 7A:
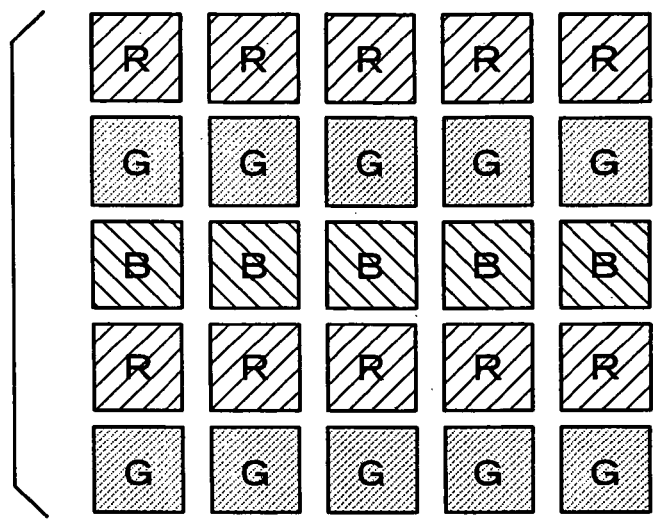
FIGS. 7A, 7B, and 7C illustrate color patterns of a color filter, where
Figure 7B:
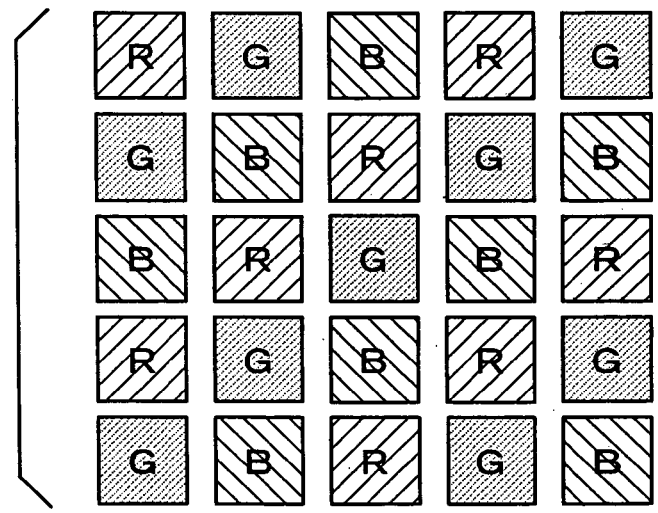
Figure 7C:
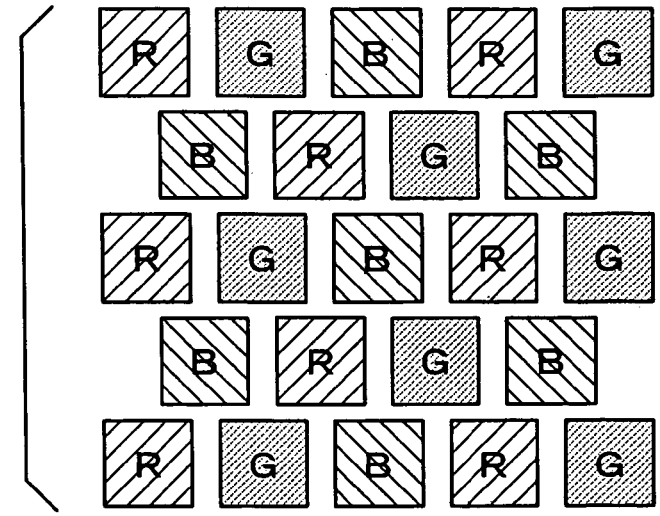

As shown in FIGS. 7A-7C, three color patterns of the color filter are available as follows: a stripe arrangement in which a transverse line of the pixel areas 607a parallel to the Y-axis direction has the same color. R, G, and B colors are repeatedly assigned to the transverse lines in the X-axis direction; a mosaic arrangement in which every three R, G, and B consecutive pixel areas 607a are arranged in the X-axis direction and the Y-axis direction; and a delta arrangement in which a plurality of the pixel areas 607a are arranged in a hound's-tooth pattern while being shifted to each other by a half pitch. R, G, and B colors are differently assigned to three consecutive pixel areas 607a. In this embodiment, a color filter of the stripe arrangement is manufactured.

The drawing process starts after the workpiece W (the suction table 31) is moved from the workpiece exchange position. A first drawing operation starts first. In the first drawing operation, the X-axis table 11 is continuously driven. The workpiece W moves forward via the set table 21. In synchronization with this movement, the functional liquid droplet ejection head 82 of the head unit 13 at the home position is selectively driven to eject functional liquid onto the workpiece W. Upon completion of the forward movement of the workpiece W, the Y-axis table 12 is driven so that the head unit 13 slightly moves in the Y-axis direction. Thereafter, the X-axis table 11 is driven again. In synchronization with this movement, the functional liquid droplet ejection head 82 is selectively driven to eject the functional liquid onto the workpiece W moving backward. Upon completion of the backward movement of the workpiece W, the Y-axis table 12 is further driven so that the head unit 13 slightly moves in the Y-axis direction. The above-described series of operations is repeated. Finally, the first drawing operation is completed.

Figure 8A:
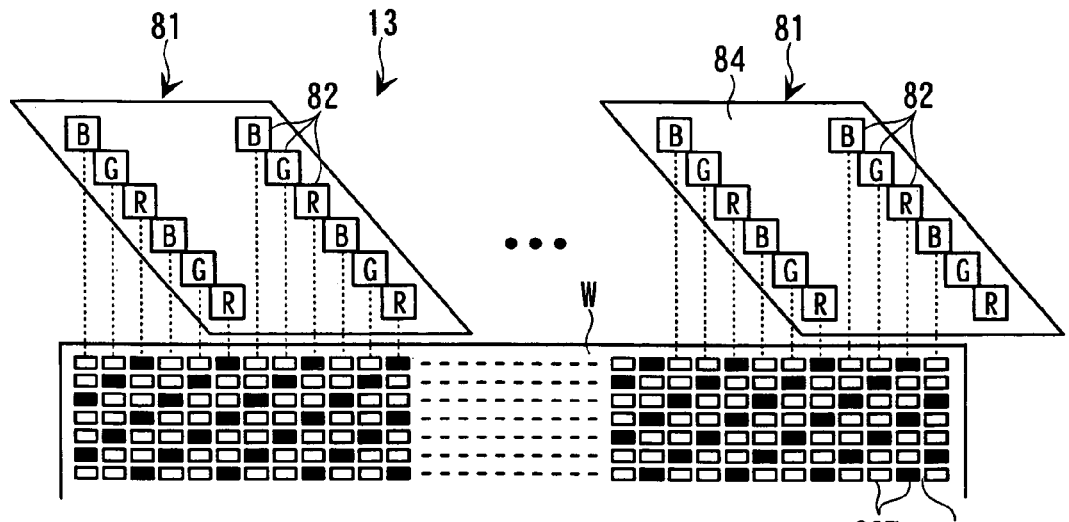
FIGS. 8A, 8B, and 8C illustrate a drawing process of the liquid droplet ejection apparatus, where

As shown in FIG. 8A, a drawing line of the head unit 13 is perpendicular to a longitudinal line of the pixel areas 607a formed in a matrix on the workpiece W, and therefore, the functional liquid droplet ejection heads 82 face each line of the pixel areas. Additionally, when the head unit 13 is located at the home position, the two rightmost functional liquid droplet ejection heads 82 in the drawing (leftmost in FIG. 2) are further shifted right from the rightmost pixel area line. When the above-described first drawing operation is carried out, the functional liquid droplet ejection heads 82 face the lines, respectively. Thus, the functional liquid is ejected to the pixel areas 607a corresponding to the same color as that of the functional liquid droplet ejection head 82.

Figure 8B:
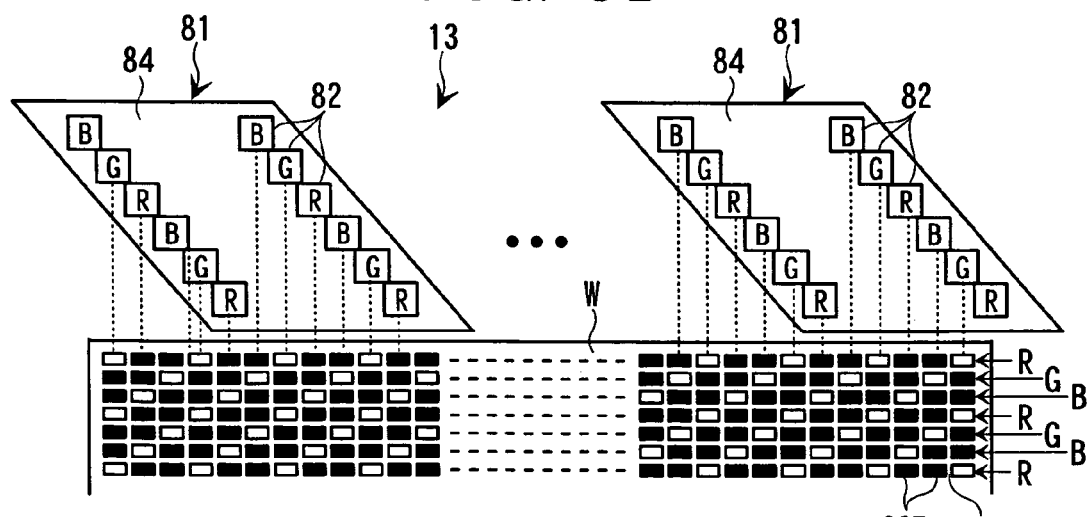
Figure 8C:
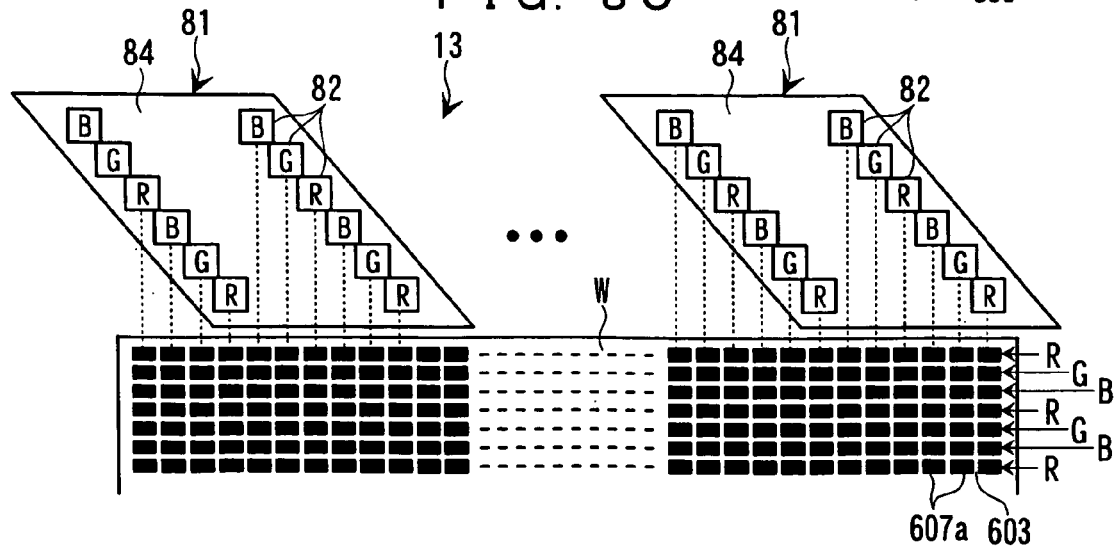

Upon completion of the first drawing operation, the Y-axis table 12 is driven so that the head unit 13 moves in the Y-axis direction by substantially the head nozzle line length L. Thus, the functional liquid droplet ejection head 82 for B color moves to the position which the functional liquid droplet ejection heads 82 for R color has previously faced in the first drawing operation. The functional liquid droplet ejection head 82 for R color moves to the position which the functional liquid droplet ejection heads 82 for G color has previously faced. The functional liquid droplet ejection head 82 for G color moves to the position which the functional liquid droplet ejection heads 82 for B color has previously faced. Subsequently, a second drawing operation is carried out. In the second drawing operation, as in the first drawing operation, the forward and backward motion of the workpiece W and the ejection operation of the functional liquid droplet ejection heads 82 are repeated twice. Thus, as shown in FIG. 8B, in the second drawing operation, functional liquid of B color is ejected onto the pixel area line to which functional liquid of R color was previously ejected. Functional liquid of R color is ejected onto the pixel area line to which functional liquid of G color was previously ejected. Functional liquid of G color is ejected onto the pixel area line to which functional liquid of B color was previously ejected.

Upon completion of the second drawing operation, the Y-axis table 12 is driven so that the head unit 13 further moves in the Y-axis direction by substantially the head nozzle line length L. Thus, the functional liquid droplet ejection head 82 for G color moves to the position which the functional liquid droplet ejection heads 82 for R color has previously faced in the first drawing operation. The functional liquid droplet ejection head 82 for B color moves to the position which the functional liquid droplet ejection heads 82 for G color has previously faced. The functional liquid droplet ejection head 82 for R color moves to the position which the functional liquid droplet ejection heads 82 for B color has previously faced. Subsequently, a third drawing operation is carried out. In the third drawing operation, as in the first and second drawing operations, the forward and backward motion of the workpiece W is repeated twice. Thus, functional liquid of R, G, and B color is ejected onto every pixel area 607a in every pixel area line. Thus, the drawing process on the workpiece W is completed. After the drawing process is completed, the two leftmost functional liquid droplet ejection head 82 in the drawing (rightmost in FIG. 2) of the head unit 13 (for G and B colors) are further shifted to the left from the leftmost pixel area line (see FIG. 8C).

As described above, in this embodiment, the color pattern for the 12×7 functional liquid droplet ejection heads 82 is created by a repetition of three R, G, and B colors. Therefore, by simply moving the head unit 13 by a nozzle line length for two heads (2L), functional liquid for all colors can be ejected to all pixel areas 607a of the workpiece W. In addition, since functional liquid for all colors is not ejected to the pixel areas 607a in the same line (also the pixel areas 607a in a transverse line in the case of a stripe arrangement) at the same time, a chance for mixing the colors is reduced even when the functional liquid is ejected onto the bank 603 due, for example, to misdirected jets. This is because the functional liquid on the bank 603 dries due to a time difference. Consequently, the color filer can be precisely manufactured.

In this embodiment, the drawing process is carried out by moving the head unit 13 forward and backward with respect to the pixel areas 607a twice. However, the number of the forward and backward movements can be changed depending on required conditions.

The flushing unit 14, the suction unit 15, the wiping unit 16, and the ejection-defect test unit 17, which are included in the maintenance means, are described next. The flushing unit 14 receives functional liquid ejected from all of the ejection nozzles 98 of the functional liquid droplet ejection heads 82 when carrying out the forcible ejection (flushing). The flushing unit 14 includes the pre-drawing flushing unit 111 and the periodic flushing unit 112.

The pre-drawing flushing unit 111 receives functional liquid ejected by pre-drawing flushing, which is carried out by driving the ejection of the functional liquid droplet ejection heads 82 of the head unit 13 immediately before the functional liquid is ejected onto the workpiece W. As shown in FIGS. 1 to 3 and FIG. 9, the pre-drawing flushing unit 111 includes a pair of the pre-drawing flushing boxes 121 for receiving the functional liquid and a pair of box supporting members (not shown) for allowing the suction table 31 (the support base 42) to support the pair of the pre-drawing flushing boxes 121. Each of the pre-drawing flushing boxes 121 is a box having an elongated rectangular shape in plan view. An absorbent material 123 which absorbs the functional liquid is attached to the bottom surface of the pre-drawing flushing box 121. Since each of the pre-drawing flushing boxes 121 is supported by the suction table 31 via the box supporting member, the pre-drawing flushing box 121 rotates together with the suction table 31 when the suction table 31 is rotated by the θ table for the θ correction.

Each of the box supporting members supports the suction table 31 while extending beyond the suction table 31 so that each of the pre-drawing flushing boxes 121 extends along two sides (peripheral edges) of the suction table 31 parallel to the Y-axis direction. That is, the two pre-drawing flushing boxes 121 are disposed so as to sandwich the suction table 31 at the front and the back. When the workpiece W is moved forward and backward in the X-axis direction, the functional liquid droplet ejection heads 82 of the head unit 13 sequentially face the pre-drawing flushing boxes 121 immediately before facing the workpiece W so as to carry out the pre-drawing flushing.

In this case, the length of the long side of the pre-drawing flushing boxes 121 is determined to be substantially the length of one drawing line plus the nozzle line length for two heads (i.e., (n+4)×L) in order to receive the forcible ejection from all of the functional liquid droplet ejection heads 82 during the drawing process. That is, in the drawing process according to this embodiment, the head unit 13 is moved in the Y-axis direction by the length for two functional liquid droplet ejection heads 82. By allowing the pre-drawing flushing boxes 121 to cover the length for one drawing line length plus the nozzle line length for two heads, the pre-drawing flushing boxes 121 can cover the ejection area in the Y-axis direction of the functional liquid droplet ejection heads 82 facing any position during the drawing process. Thus, stable ejection of the functional liquid droplet from the functional liquid droplet ejection heads 82 can be provided, and therefore, the drawing process can be precisely carried out on the workpiece W.

Although not shown, each of the box supporting members includes a box elevation mechanism for elevating the pre-drawing flushing boxes 121. During the drawing process, that is, when receiving the pre-drawing flushing, the box supporting member supports the pre-drawing flushing box 121 so that the top surface of the pre-drawing flushing boxes 121 is at the same height level as the surface of the workpiece W set on the suction table 31. During the non-drawing process, the box supporting member supports the pre-drawing flushing box 121 so that the top surface of the pre-drawing flushing boxes 121 is at a lower height level than the top surface (set surface) of the suction table 31 (i.e., at a standby position). Accordingly, the pre-drawing flushing boxes 121 can receive the functional liquid for the pre-drawing flushing without spattering the functional liquid outside. In addition, the pre-drawing flushing boxes 121 do not interfere with the mounting operation of the workpiece W during the non-drawing process. When considering the expansion of the absorbent material 123, the height level of the top surface of the pre-drawing flushing box 121 may be slightly lower than that of the workpiece W. However, the box elevation mechanism may be eliminated depending on actual conditions.

As shown in FIGS. 1 through 3 and FIG. 9, the periodic flushing unit 112 is used to receive functional liquid of periodic flushing carried out by the functional liquid droplet ejection heads 82 of the head unit 13 when the drawing process is temporarily stopped, for example, during the mounting and dismounting operation of the workpiece W. The periodic flushing unit 112 includes a periodic flushing box 131 for receiving the functional liquid and a pair of box support rods 132 mounted in the X-axis air slider 22. The box support rods 132 support both ends of the periodic flushing box 131 so that the height of the periodic flushing box 131 is adjustable.

The periodic flushing box 131 is an open-topped box with a rectangular shape having a long side in the Y-axis direction in plan view. The periodic flushing box 131 has a size that can contain all of the 12×7 functional liquid droplet ejection heads 82 mounted in the head unit 13. The periodic flushing box 131 can allow all of the functional liquid droplet ejection heads 82 to carry out periodic flushing at the same time. More specifically, like the pre-drawing flushing boxes 121, the length of the long side of the periodic flushing box 131 is determined to be the length of one drawing line plus the nozzle line length for two heads (i.e., (n+4)×L). The length of the short side of the periodic flushing box 131 is determined to be substantially the height of the head plate 84, which has a parallelogram shape in plan view, (i.e., the length in the X-axis direction). As shown in FIG. 9, a plurality of ribs 133 (3 ribs) are arranged to protrude from the bottom surface of the periodic flushing box 131 while extending in the Y-axis direction. Sheet-shaped absorbent materials 134 for absorbing the functional liquid are arranged on these ribs 133. The top surfaces of the absorbent materials 134 substantially coincide with the top surface plane of the periodic flushing box 131.

The box support rods 132 support the periodic flushing box 131 so that the top surface plane of the periodic flushing box 131 is slightly lower than the nozzle surface 97 of the functional liquid droplet ejection heads 82 mounted on the head unit 13 (by 2 to 3 mm). The box support rods 132 are secured to the slider body 51 of the X-axis air slider 22 along with the set table 21. When the X-axis air slider 22 moves, the periodic flushing box 131 also moves in the X-axis direction via a box stand. The box support rods 132 support the periodic flushing box 131 at a position behind the set table 21. When the X-axis air slider 22 moves to allow the suction table 31 to be located at the workpiece exchange position, the periodic flushing box 131 faces the head unit 13 to receive the functional liquid of the periodic flushing.

Although not shown, the periodic flushing box 131 includes a warpage protection mechanism for preventing the warpage and deflection of the absorbent materials 134. In this embodiment, a gap between the absorbent materials 134 and the nozzle surface 97 of the functional liquid droplet ejection heads 82 is small. Accordingly, if the absorbent materials 134 absorbs the functional liquid of the periodic flushing while curving upward, the absorbent materials 134 expanded by the functional liquid may be brought into contact with the nozzle surface 97. To solve this problem, the warpage protection mechanism is provided to the periodic flushing box 131. Thus, the occurrence of the warpage of the absorbent materials 134 is prevented, and therefore, the absorbent materials 134 is prevented from being brought into contact with the nozzle surface 97 of the functional liquid droplet ejection heads 82.

The suction unit 15 sucks the functional liquid droplet ejection heads 82 to force the ejection nozzles 98 of the functional liquid droplet ejection heads 82 to discharge functional liquid. As shown in FIG. 2, the suction unit 15 supports the head unit 13, namely, the seven carriage units 81. The suction unit 15 includes seven divided suction units 141 having the same structure arranged on the platform 5. Each of the divided suction units 141 includes a cap unit 142 that approaches the carriage units 81 to be sucked from their bottoms and causes twelve caps 143 to be brought into tight contact with the nozzle surfaces 97 of the respective twelve functional liquid droplet ejection heads 82 mounted on the carriage units 81, a cap elevation mechanism (not shown) for moving the cap unit 142 up and down to allow the cap unit 142 to move towards and away from the functional liquid droplet ejection heads 82 (the nozzle surface 97), and sucking means (ejector: not shown) for sucking the functional liquid droplet ejection heads 82 via the caps 143 in tight contact with the functional liquid droplet ejection heads 82.

The functional liquid is sucked off in order to recover or prevent clogging of the functional liquid droplet ejection heads 82 (the ejection nozzles 98). Also, the functional liquid is sucked in order to fill the functional liquid flow channels from the functional liquid tank to the functional liquid droplet ejection heads 82 with the functional liquid when a new liquid droplet ejection apparatus 1 is installed or the functional liquid droplet ejection head 82 is replaced with a new one. Additionally, the caps 143 are used to maintain the functional liquid droplet ejection heads 82 when the liquid droplet ejection apparatus 1 is not in use. In this case, the head unit 13 faces the suction unit 15 and the caps 143 are brought into tight contact with the nozzle surfaces 97 of the functional liquid droplet ejection heads 82. Thus, the nozzle surfaces 97 are sealed so as to prevent the functional liquid droplet ejection heads 82 (the ejection nozzles 98) from drying.

The caps 143 of the suction unit 15 further function as flushing boxes for receiving functional liquid ejected by the forcible ejection (preliminary ejection) of the functional liquid droplet ejection heads 82. When only some of the carriage units 81 facing the suction unit 15 are sucked, the other carriage units 81 not to be sucked carry out the forcible ejection to the caps 143. In this case, the caps 143 are moved to the position where the top surfaces of the caps 143 are slightly separated from the nozzle surfaces 97 by the cap elevation mechanism.

The wiping unit 16 wipes the nozzle surfaces 97 of the functional liquid droplet ejection heads 82 using a wiping sheet 151 to which cleaning liquid has been sprayed. As shown in FIG. 2, the wiping unit 16 includes a take-up unit 152 for feeding the wiping sheet 151 wound as a roll and reeling the fed wiping sheet 151, a cleaning liquid supplying unit 153 for spraying cleaning liquid to the fed wiping sheet 151, and a wiping unit 154 for wiping the nozzle surfaces 97 with the wiping sheet 151 on which the cleaning liquid has been sprayed. The wiping operation is carried out after the sucking operation of the suction unit 15 is carried out, so that dust and dirt deposited on the nozzle surfaces 97 are wiped out. The wiping unit 16 is arranged at a position closer to the X-axis table 11 than the suction unit 15. The wiping unit 16 faces the head unit 13 (each carriage unit 81) returning to the home position after the sucking operation by the suction unit 15 so that the wiping unit 16 can efficiently carry out the wiping operation.

Although not shown, each of the divided suction units 141 of the suction unit 15 and the wiping unit 16 are supported by the unit elevation mechanism so as to be lifted up and down. By moving down the suction unit 15 (the divided suction units 141) and the wiping unit 16 to a predetermined standby position, a working space can be ensured above the suction unit 15 (the divided suction units 141) and the wiping unit 16 so that the suction unit 15 (the divided suction units 141) and the wiping unit 16 can be maintained and the head plate 84 mounted on the carriage unit 81 can be replaced.

As shown in FIG. 1 through 3 and FIG. 9, the ejection-defect test unit 17 checks whether functional liquid is properly ejected from the functional liquid droplet ejection heads 82 (the ejection nozzles 98) mounted on the head unit 13. The ejection-defect test unit 17 includes the drawn unit 161 for receiving functional liquid ejected for testing from all of the ejection nozzles 98 of all functional liquid droplet ejection heads 82 of the head unit 13 to draw a predetermined test pattern; and an image capturing unit 162 for capturing an image of the test pattern drawn on the drawn unit 161 to test it.

The drawn unit 161 includes a long drawing sheet 171 (e.g., roll sheet) on which the test pattern is drawn, take-up means 172 for feeding the drawing sheet 171 and reeling the fed the drawing sheet 171, a take-up support member 173 for supporting the take-up means 172, and a unit base 174 for supporting the take-up support member 173. The drawing sheet 171 is loaded into the take-up means 172, which includes a feeding reel 175 for unreeling the drawing sheet 171 and a take-up reel 176 for reeling the drawing sheet 171, and a take-up motor (geared motor: not shown) for rotating the take-up reel 176. The fed drawing sheet 171 moves horizontally in the Y-axis direction while being exposed to the outside and is reeled by the take-up reel 176. The horizontally moving portion of the drawing sheet 171 serves as a drawn portion for receiving the test pattern. The length of a long side of the horizontally moving portion in the Y-axis direction is determined so that the horizontally moving portion can receive test ejection from all of the functional liquid droplet ejection heads 82 of the head unit. In this embodiment, like the pre-drawing flushing boxes 121 and the periodic flushing box 131, the length is determined to be the length of one drawing line plus the nozzle line length for two heads.

The drawing sheet 171 is not reeled every time the test pattern is drawn, but is reeled after the test pattern is drawn on the fed drawing sheet 171 a predetermined number of times.

In this case, to prevent a test pattern by each test ejection from overlapping with each other, a currently drawn test pattern is slightly shifted from the previously drawn test pattern in the X-axis direction. After the test pattern is drawn a predetermined number of times so that the entire width of the drawing sheet 171 is filled with the drawn test patterns, the take-up motor is activated to reel the drawn drawing sheet 171 and feed the new drawing sheet 171. In this embodiment, the drawing sheet 171 is automatically reeled by the motor. However, in the case of infrequent reeling operations, a manual take-up mechanism may be provided to reel the drawing sheet 171 manually.

Additionally, in this embodiment, the drawing sheet 171 wound as a roll is used to draw the test pattern. However, a glass substrate may be used for the test pattern in place of the rolled drawing sheet 171. In this case, the glass substrate is appropriately replaced with a new one. However, the glass sheet on which the test pattern is drawn can be repeatedly used after being cleaned.

The unit base 174 is disposed between the set table 21 and the periodic flushing unit 112 and is supported by the slider body 51. The take-up support member 173 supports the take-up means 172 between one of the pre-drawing flushing boxes 121 adjacent to the periodic flushing box 131 and the periodic flushing box 131. Accordingly, when the suction table 31 is moved to the workpiece exchange position to replace the workpiece W after the drawing process, the drawing sheet 171 fed before the periodic flushing box 131 faces the head unit 13 faces the head unit 13 so that a test pattern can be drawn on the drawing sheet 171.

As shown in FIG. 3, the image capturing unit 162 is supported by the above-described Y-axis support bases 3 and faces the X-axis table 11 from above. The image capturing unit 162 includes two test cameras 181 for capturing an image of the test pattern drawn on the drawing sheet 171, a camera holder 182 for holding the two test cameras 181, a camera moving mechanism 183 which is secured to the Y-axis support bases 3 and which supports the test cameras 181 via the camera holder 182 in a slidable manner in the Y-axis direction, and a camera moving motor (not shown) for moving the test cameras in the Y-axis direction via the camera moving mechanism 183. The two test cameras 181 captures half images of the test pattern drawn on the drawing sheet 171, respectively. For example, the two test cameras 181 are arranged at a distance of substantially a half length of one drawing line of the head unit 13 from each other. The two test cameras 181 are moved so that the left test camera 181 captures the left half of the test pattern and the right test camera 181 captures the right half of the test pattern. Thus, the test pattern can be efficiently image-captured (scanned) in a short time. As a result, the time required for testing an ejection defect of the functional liquid droplet ejection heads 82 can be reduced.

The image capturing unit 162 is arranged so that the two test cameras 181 face the drawing sheet 171 when the suction table 31 is located at the workpiece exchange position. In this embodiment, the image of the test pattern can be captured during mounting and dismounting the workpiece W. The image capturing result from the two test cameras 181 is transmitted to the control means 18, by which the image is recognized. It is then determined whether each of the ejection nozzles 98 of the functional liquid droplet ejection heads 82 properly ejects functional liquid, that is, it is determined whether each of the ejection nozzles 98 is clogged or not on the basis of the image recognition. This determination is also made during mounting and dismounting of the workpiece W.

That is, the ejection-defect test unit 17 includes the image capturing unit 162 and the control means 18.

Although not shown, a unit moving mechanism for slightly moving the whole take-up means 172 in the X-axis direction is provided between the unit base 174 and the take-up support member 173. As described above, although the drawing position of the test pattern drawn on the drawing sheet 171 is gradually shifted in the X-axis direction, the test pattern can reliably face the fixed image capturing unit (the two test cameras 181) in the X-axis direction by moving the take-up means 172 in the X-axis direction in accordance with the drawing position of the test pattern.

In addition, an initial head alignment can be carried out by adjusting the position of each of the carriage units 81 of the head unit 13 using the ejection-defect test unit 17 so that the divided drawing lines form one straight drawing line.

Figure 10:
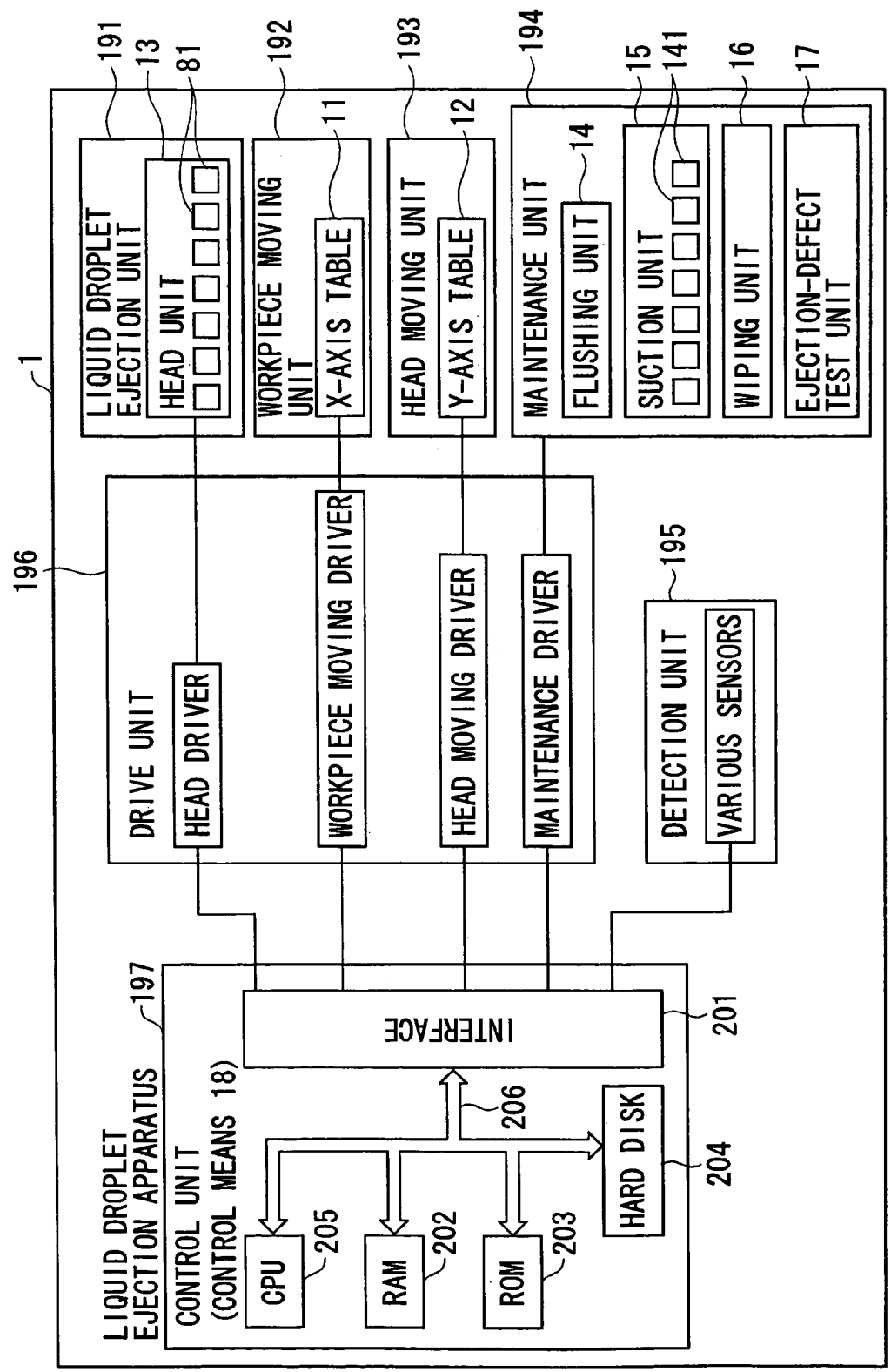
FIG. 10 is a block diagram of a main control system of a drawing apparatus.

A main control system of the liquid droplet ejection apparatus 1 is described next with reference to FIG. 10. As shown in FIG. 10, the liquid droplet ejection apparatus 1 includes a liquid droplet ejection unit 191 having the head unit 13 (the functional liquid droplet ejection heads 82); a workpiece moving unit 192 having the X-axis table 11 to move a workpiece in the X-axis direction; a head moving unit 193 having the Y-axis table 12 to move the workpiece in the Y-axis direction; a maintenance unit 194 having all units of maintenance means; a detection unit 195 having a variety of sensors to detect a variety of conditions; a drive unit 196 having a variety of drivers to control the above-described units; and a control unit 197 (the control means 18) connected to the above-described units so as to perform overall control of the liquid droplet ejection apparatus 1.

The control unit 197 includes an interface 201 for connecting each means; a random access memory (RAM) 202 having a storage area capable of temporarily storing data and used as a work area for control processing; a read only memory (ROM) 203 having a variety of storage areas for storing a control program and control data; a hard disk 204 for storing drawing data used for drawing a predetermined drawing pattern on the workpiece W, a variety of data from the units, and programs for processing the variety of data; a central processing unit (CPU) 205 for computing a variety of data under the control of programs stored in the ROM 203 and the hard disk 204; and a bus 206 connecting these units to each other.

The control unit 197 inputs a variety of data from the means via the interface 201, allows the CPU 205 to compute the data under the control of the programs stored in the hard disk 204 or programs sequentially read out of a CD-ROM drive, and outputs the computation result to the means via the drive unit 196 (a variety of drivers). Thus, the whole liquid droplet ejection apparatus 1 is controlled and a variety of processing of the liquid droplet ejection apparatus 1 is carried out.

A series of operations of the liquid droplet ejection apparatus 1 from the mounting operation of an unprocessed workpiece W on the set table 21 (the suction table 31) to another mounting operation for the next workpiece W is described below. When the workpiece W is mounted on the suction table 31 at the workpiece exchange position by a robot arm (a workpiece carrying-in-and-out apparatus: not shown), the control unit 197 drives the workpiece alignment cameras 62 to capture the image of the workpiece W and image-recognizes the captured result. The control unit 197 then drives the θ table 32 on the basis of the recognition result to correct the position (θ) of the workpiece W. During this operation, the head unit 13 faces the periodic flushing unit 112 and the periodic flushing operation of the functional liquid droplet ejection heads 82 is carried out.

Upon completion of correcting the position of the workpiece W, the control unit 197 completes the periodic flushing operation and drives the X-axis table 11 to move the suction table 31 from the workpiece exchange position to the position adjacent to the head unit 13. The control unit 197 then starts the above-described series of drawing operations. In this embodiment, the area of the suction table 31 and the pair of pre-drawing flushing boxes 121 attached to the suction table 31 is determined to be a drawing area for the drawing process. During the series of drawing operations, the X-axis table 11 is driven so that the head unit 13 faces the inside of the drawing area and the suction table 31 (the workpiece W) moves forward and backward. Accordingly, during the drawing process, the pre-drawing flushing boxes 121 and the workpiece W sequentially face the head unit 13 to carry out pre-drawing flushing and drawing on the workpiece W. Since the periodic flushing unit 112 and the ejection-defect test unit 17 that carry out no drawing process do not face the head unit 13, the drawing process can be efficiently and properly carried out.

After the functional liquid is ejected onto the workpiece W and the drawing process (the second backward movement of the workpiece W in the third drawing operation) is completed, the X-axis table 11 is continuously driven so that the workpiece W is moved to the workpiece exchange position. At that time, the control unit 197 drives the ejection of all of the functional liquid droplet ejection heads 82 of the head unit 13 to cause all of the functional liquid droplet ejection heads 82 to carry out test ejection. Thus, during the movement of the workpiece W, the test pattern is drawn on the drawing sheet 171 of the ejection-defect test unit 17 facing the head unit 13 (the functional liquid droplet ejection heads 82). As described above, in this embodiment, by using the moving operation of the workpiece W towards the workpiece exchange position after the drawing process, the test pattern is drawn on the drawing sheet 171. Consequently, since the head unit 13 need not move to carry out the test ejection, the test pattern can be efficiently drawn.

When the workpiece W (the suction table 31) reaches the workpiece exchange position, the control unit 197 stops driving of the X-axis table 11 and drives the Y-axis table 12 so that the head unit 13 returns to the home position. The control unit 197 then causes the functional liquid droplet ejection heads 82 of the head unit 13 to carry out an ejecting operation of periodic flushing into the periodic flushing box 131 located immediately beneath the head unit 13. Simultaneously, a robot arm (not shown) retrieves the processed workpiece W and sets a new unprocessed workpiece W on the set table 21.

Additionally, when the workpiece W reaches the workpiece exchange position, the control unit 197 drives the camera moving motor to move the two test cameras 181 in the X-axis direction. The two test cameras 181 capture the image of the test pattern drawn on the drawing sheet 171. The control unit 197 then image-recognizes the captured image to determine whether an ejection defect of each of the functional liquid droplet ejection heads 82 of the head unit 13 occurs. If it is determined that all of the functional liquid droplet ejection heads 82 properly eject functional liquid, the ejection defect test is completed. After the workpiece W is replaced, the control unit 197 stops the periodic flushing operation and drives the X-axis table 11 so that the set table 21 is moved towards the head unit 13 to carry out the next drawing process.

However, if it is determined that an ejection defect of the functional liquid droplet ejection heads 82 occurs, a maintenance process is carried out for the functional liquid droplet ejection heads 82. More specifically, the carriage unit 81 including the faulty functional liquid droplet ejection head 82 is moved to face the suction unit 15 (the divided suction unit 141), which sucks the faulty functional liquid droplet ejection head 82. The carriage unit 81 is then moved to face the wiping unit 16, which carries out a wiping operation. In this embodiment, the home position of the head unit 13 is located in the vicinity of the suction unit 15 (and the wiping unit 16). Accordingly, when it is determined that an ejection defect occurs, the head unit 13 at the home position can rapidly moves and faces the suction unit 15 to carry out the maintenance operation.

The head unit 13 according to this embodiment includes seven independently movable carriage units 81. Consequently, when it is determined that an ejection defect of the functional liquid droplet ejection heads 82 occurs, all of the seven carriage units 81 need not move to face the suction unit 15 or the wiping unit 16. For example, when, as shown in FIG. 2, an ejection defect of the functional liquid droplet ejection head 82 of the third carriage unit 81 from the left is, detected, the first to third carriage units 81 from the left are moved to face the suction unit 15. The sucking operation is then carried out for only the, third carriage unit 81 from the left. In this case, the functional liquid droplet ejection heads 82 of the carriage units 81 left at the home position continue to carry out the periodic flushing operation. For the normal carriage units 81 facing the suction unit 15, the caps 143 of the suction unit 15 face the functional liquid droplet ejection heads 82 with spaces therebetween. The functional liquid droplet ejection heads 82 then carry out the flushing operation to the caps 143.

After the series of maintenance process of the carriage units 81 including the functional liquid droplet ejection heads 82 is completed and the carriage units 81 which moved towards the suction unit 15 return to the home position, the control unit 197 drives the X-axis table 11 so that the drawing sheet 171 of the ejection-defect test unit 17 faces the head unit 13 and another test pattern is drawn on the drawing sheet 171. The operation similar to the above-described series of operations is repeated. The head unit 13 moves to the home position to carry out the periodic flushing operation. It is then determined whether the ejection defect of the functional liquid droplet ejection heads 82 is recovered.

As described above, in the liquid droplet ejection apparatus 1 according to this embodiment, the image of the test pattern is captured and the ejection defect is determined on the basis of the captured image while the workpiece W is replaced. Accordingly, the time for mounting and dismounting the workpiece W can be efficiently used, thus reducing the total tact time. In addition, after the drawing process of the workpiece W is completed, it is determined whether an ejection defect of each of the functional liquid droplet ejection heads 82 of the head unit 13 occurs before the drawing process starts for a new unprocessed workpiece W. Therefore, the manufacturing yield can be increased.

Additionally, in the liquid droplet ejection apparatus 1 according to this embodiment, when the suction table 31 is moved to the workpiece exchange position, the periodic flushing box 131 faces the head unit 13. During the workpiece mounting and dismounting operation, the periodic flushing is continuously carried out. Accordingly, during the workpiece mounting and dismounting operation (and during the ejection defect testing operation), the ejection nozzles 98 of the functional liquid droplet ejection heads 82 can be effectively prevented from clogging. In addition, the amount of functional liquid ejected from the functional liquid droplet ejection heads 82 can be stably maintained. In particular, since the periodic flushing box 131 is disposed on the moving axis of the set table 21, the periodic flushing operation can continue until the workpiece W starts to move from the workpiece exchange position (in order to start a new drawing operation). Therefore, the functional liquid droplet ejection heads 82 can be maintained in good conditions.

In this embodiment, like the pre-drawing flushing boxes 121, the length of the periodic flushing box 131 and the horizontally moving portion of the drawing sheet 171 of the drawn unit 161 is determined to be the one drawing line length plus the nozzle line length for two heads in order to cover the functional liquid ejection area of the head unit 13 for the drawing process. Accordingly, the periodic flushing operation may be carried out during the moving operation of the head unit 13 from the end position of the drawing process to the home position which is the start position of the next drawing process. This results in a further reduction of the stop time of the functional liquid droplet ejection heads 82. As a result, the functional liquid droplet ejection heads 82 can be efficiently prevented from clogging.

When the head unit 13 carries out a drawing process while moving in the sub scanning direction and when the drawing process of odd order starts from the home position of the head unit 13 and the drawing process of even order starts from the end position of the drawing process of the odd order (i.e., the drawing process of odd order is carried out in the direction opposite to that for the drawing process of even order), the periodic flushing operation can be carried out whether the head unit 13 is positioned at the start position of drawing process of odd order or at the start position of drawing process of even order.

The length of the periodic flushing box 131 and the horizontally moving portion of the drawing sheet 171 of the drawn unit 161 may be determined to be the one drawing line length. In this case, to receive periodic flushing during the mounting and dismounting operation of the workpiece W, the periodic flushing box 131 is arranged on the X-axis air slider 22 to face the head unit 13 at the home position (adjacent to the suction unit 15). The drawn unit 161 is arranged on the X-axis air slider 22 to face the head unit 13 so that the X-axis air slider 22 faces the head unit 13 from the time the drawing process is completed until the workpiece W moves to the workpiece exchange position.

Additionally, in this embodiment, the set table 21, the periodic flushing unit 112, and the ejection-defect test unit 17 are mounted on the same X-axis air slider 22 (the slider body 51). However, by dividing the slider body 51 into two sliders independently slidable in the X-axis direction by the X-axis linear motor, the set table 21 may be mounted on one slider, and the periodic flushing unit 112 and the drawn unit 161 of the ejection-defect test unit 17 may be mounted on the other slider. In this case, when moving the set table 21 from the workpiece exchange position and when moving the set table 21 to the workpiece exchange position, the two sliders are integrally moved by the X-axis linear motor. During the drawing process, the X-axis linear motor drives only the slider on which the set table 21 is mounted to move forward and backward for carrying out pre-drawing flushing and drawing on the workpiece W.

In this embodiment, the workpiece W is moved in the main scanning direction whereas the head unit 13 is moved in the sub scanning direction. However, the head unit 13 may be moved in the main scanning direction and the workpiece W may be moved in the sub scanning direction. Alternatively, the workpiece W may be fixed and the head unit 13 may be moved in the main scanning direction and the sub scanning direction. In either case, as described above, by arranging the flushing unit 14 and the ejection-defect test unit 17 on the main scan moving axis, the flushing operation and the ejection defect test can be efficiently carried out.

Furthermore, it should therefore be understood that the invention is not limited to the particular embodiments described herein, but is intended to include all changes and modifications that are within the scope and spirit of the invention.

The arrangement and the manufacturing process of an electro-optic device (flat panel display) manufactured using the liquid droplet ejection apparatus 1 according to this embodiment are described below. Examples of the electro-optic devices include a color filter, a liquid crystal display device, an organic electroluminescent device, a plasma display panel (PDP) device, an electron emission device (FED or SED device), and an active matrix substrate composed of these devices. As used herein, the term "active matrix substrate" refers to a substrate on which a thin-film transistor and source and data lines electrically connected to the thin-film transistor are formed.

Figure 11:
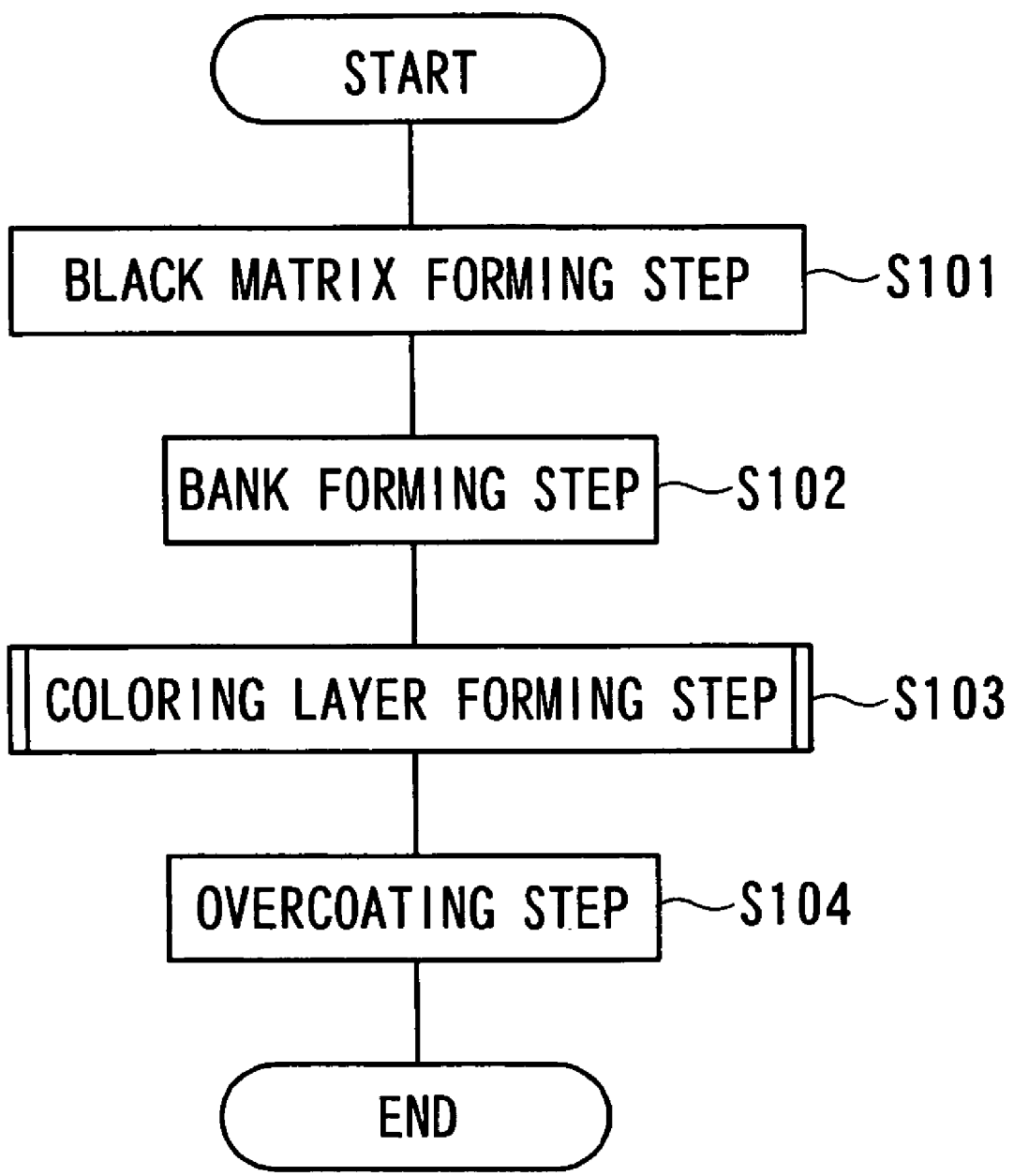
FIG. 11 is a flow chart illustrating the manufacturing steps of the color filter.

A method for manufacturing a color filter incorporated in liquid crystal display devices and organic electroluminescent devices is described first. FIG. 11 is a flow chart illustrating the manufacturing steps of the color filter. FIGS. 12A through 12E are schematic cross-sectional views of a color filter 600 (filter base 600A) shown in the manufacturing steps according to this embodiment.

Figure 12A:
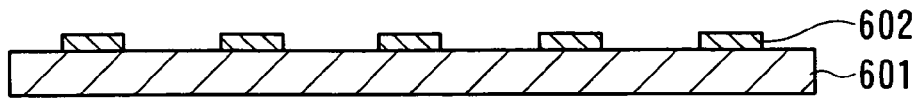
FIGS. 12A through 12E are schematic cross-sectional views of a color filter in manufacturing steps.

In a black matrix forming step (S101), as shown in FIG. 12A, a black matrix 602 is formed on a substrate (W) 601. The black matrix 602 is formed from chromium metal, a laminate of chromium metal and chromium oxide, or a resin black. The black matrix 602 can be formed from a thin metal film by a sputtering method or a vapor deposition method. Additionally, the black matrix 602 can be formed from a thin resin film by a gravure printing method, a photo resist method, or a thermal transfer method.

Figure 12B:
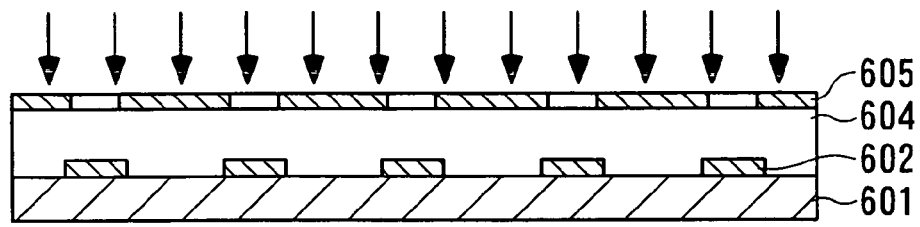

Subsequently, in a bank forming step (S102), a bank 603 is formed while overlapping the black matrix 602. That is, as shown in FIG. 12B, a resist layer 604 is formed using a transparent negative photosensitive resin while covering the substrate 601 and the black matrix 602. Thereafter, the top surface of the resist layer 604 is covered by a mask film 605 formed in a matrix and then an exposure process is carried out.

Figure 12C:
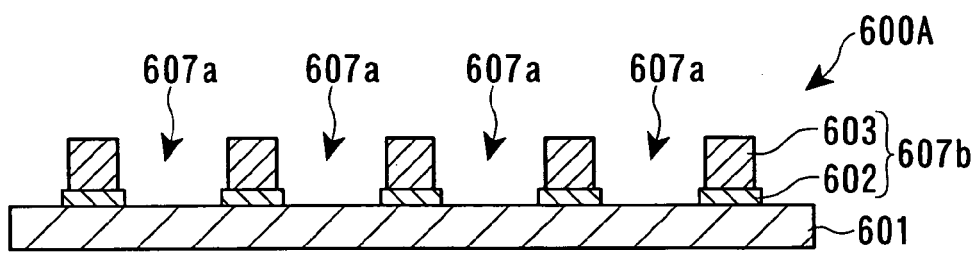

As shown in FIG. 12C, the resist layer 604 is then patterned by etching the unexposed portion of the resist layer 604. Thus, the bank 603 is formed. If the black matrix is formed with a resin black, the black matrix can serve as the bank.

The bank 603 and the black matrix 602 beneath the bank 603 form a partition wall 607b for separating pixel areas 607a from each other and define projected areas of the functional liquid when the functional liquid droplet ejection heads 82 form coloring layers (coating portions) 608R, 608G, and 608B in the subsequent coloring layer forming step.

The above-described black matrix forming step and bank forming step produce the filter base 600A.

In this embodiment, a resin material whose coating surface is lyophobic (hydrophobic) is used for a material of the bank 603. Since the surface of the substrate (glass substrate) 601 is lyophilic (hydrophilic), the precision of the projected position of the droplet in each of the pixel areas 607a surrounded by the bank 603 (the partition wall 607b) is improved.

Figure 12D:
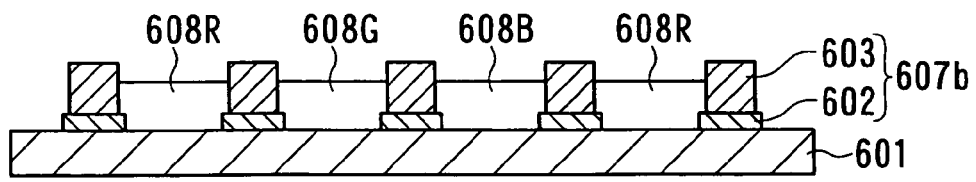

Subsequently, in the coloring layer forming step (S103), as shown in FIG. 12D, the functional liquid droplet ejection heads 82 ejects a functional liquid droplet into each of the pixel areas 607a surrounded by the partition wall 607b. In this case, the functional liquid droplet ejection heads 82 ejects functional liquid (filter material) of three R, G, and B colors. The arrangement pattern for R, G, and, B colors includes a stripe arrangement, a mosaic arrangement, and a delta arrangement.

Figure 12E:
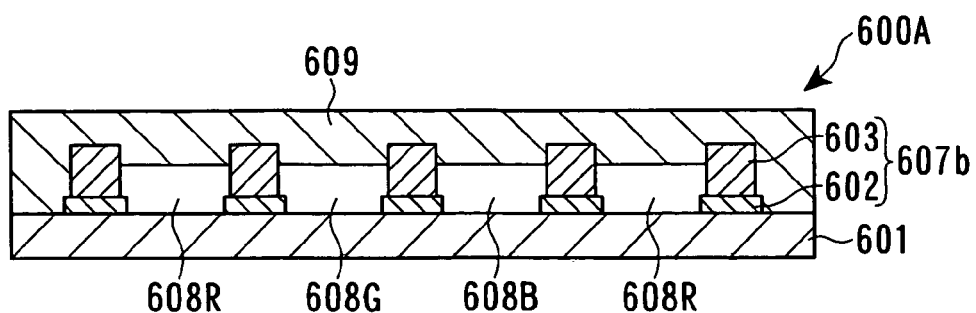

Thereafter, a drying process (e.g., a heating process) is carried out to fix the functional liquid. Thus, the three coloring layers 608R, 608G, and 608B are formed. After the three coloring layers 608R, 608G, and 608B are formed, an overcoating step (S104) is carried out. As shown in FIG. 12E, an overcoat 609 is formed to cover the top surfaces of the substrate 601, the partition wall 607b, and the coloring layers 608R, 608G, and 608B.

That is, after liquid for the overcoat is ejected to the entire surface on which the coloring layers 608R, 608G, and 608B of the substrate 601 are formed, a drying process (e.g., a heating process) is carried out to form the overcoat 609.

After the overcoat 609 is formed, a coating step is carried out, in which Indium Tin Oxide (ITO) for forming a transparent electrode in the subsequent step is coated.

FIG. 13 is a cross-sectional view of an essential part of the structure of a passive matrix liquid crystal device (liquid crystal device), which is one of the examples of a liquid crystal display device using the color filter 600. By mounting a liquid crystal drive integrated circuit (IC), a backlight, and a support member on a liquid crystal device 620, a transmissive liquid crystal display device is achieved as a final product. Since the color filter 600 is identical to that shown in FIG. 12, the same components as those illustrated and described in relation to FIG. 12 are designated by the same reference numerals, and the descriptions thereof are not repeated here.

The liquid crystal device 620 includes the color filter 600, an opposite substrate 621 composed of, for example, a glass substrate, and a liquid crystal layer 622 composed of a super twisted nematic (STN) liquid crystal composition and sandwiched by the color filter 600 and the opposite substrate 621. The color filter 600 is disposed at the upper side of FIG. 13 (adjacent to an observer).

Although not shown, a polarizer is disposed on each of the outer surfaces of the opposite substrate 621 and the color filter 600 (the surfaces remote from the liquid crystal layer 622). A backlight is disposed outside the polarizer on the opposite substrate 621.

A plurality of evenly spaced long rectangular first electrodes 623 are formed on the surface of the overcoat 609 of the color filter 600 (adjacent to the liquid crystal layer 622) while extending in the transverse direction of FIG. 13. A first alignment layer 624 is formed to cover the surfaces of the first electrodes 623 remote from the color filter 600.

In contrast, a plurality of evenly spaced long rectangular second electrodes 626 are formed on the surface of the opposite substrate 621 facing the color filter 600 while extending in a direction perpendicular to the first electrodes 623 of the color filter 600. A second alignment layer 627 is formed to cover the surfaces of the second electrodes 626 adjacent to the liquid crystal layer 622. The first electrodes 623 and the second electrodes 626 are formed from a transparent conductive material, such as ITO.

Spacers 628 are disposed in the liquid crystal layer 622 to maintain the thickness of the liquid crystal layer 622 (cell gap) to be constant. A seal 629 prevents a liquid crystal composition in the liquid crystal layer 622 from leaking to the outside. One end of each of the first electrodes 623 functions as an interconnection line 623a and extends to the outside of the seal 629. Areas where the first electrodes 623 intersect the second electrodes 626 serve as pixels. The liquid crystal device 620 is designed so that the coloring layers 608R, 608G, and 608B of the color filter 600 are positioned at these areas.

In a commonly used manufacturing process, the color filter 600 is patterned to form the first electrodes 623. The first alignment layer 624 is then applied on the first electrodes 623 to achieve the color filter 600. The opposite substrate 621 is patterned to form the second electrodes 626. The second alignment layer 627 is then applied on the second electrodes 626 to achieve the opposite substrate 621. Thereafter, the spacers 628 and the seal 629 are formed on the opposite substrate 621. The color filter 600 is then bonded to the opposite substrate 621. Subsequently, after liquid crystal for forming the liquid crystal layer 622 is injected from an injection port of the seal 629, the injection port is sealed. The two polarizers and a backlight are then layered.

According to this embodiment, for example, the liquid droplet ejection apparatus 1 can apply a material of the spacers (functional liquid), which forms the cell gap, while uniformly applying liquid crystal (functional liquid) on an area surrounded by the seal 629 before the color filter 600 is bonded to the opposite substrate 621. In addition, the liquid droplet ejection apparatus 1 can print the seal 629 using the functional liquid droplet ejection heads 82. Furthermore, the liquid droplet ejection apparatus 1 can apply the first alignment layer 624 and the second alignment layer 627 using the functional liquid droplet ejection heads 82.

Figure 14:
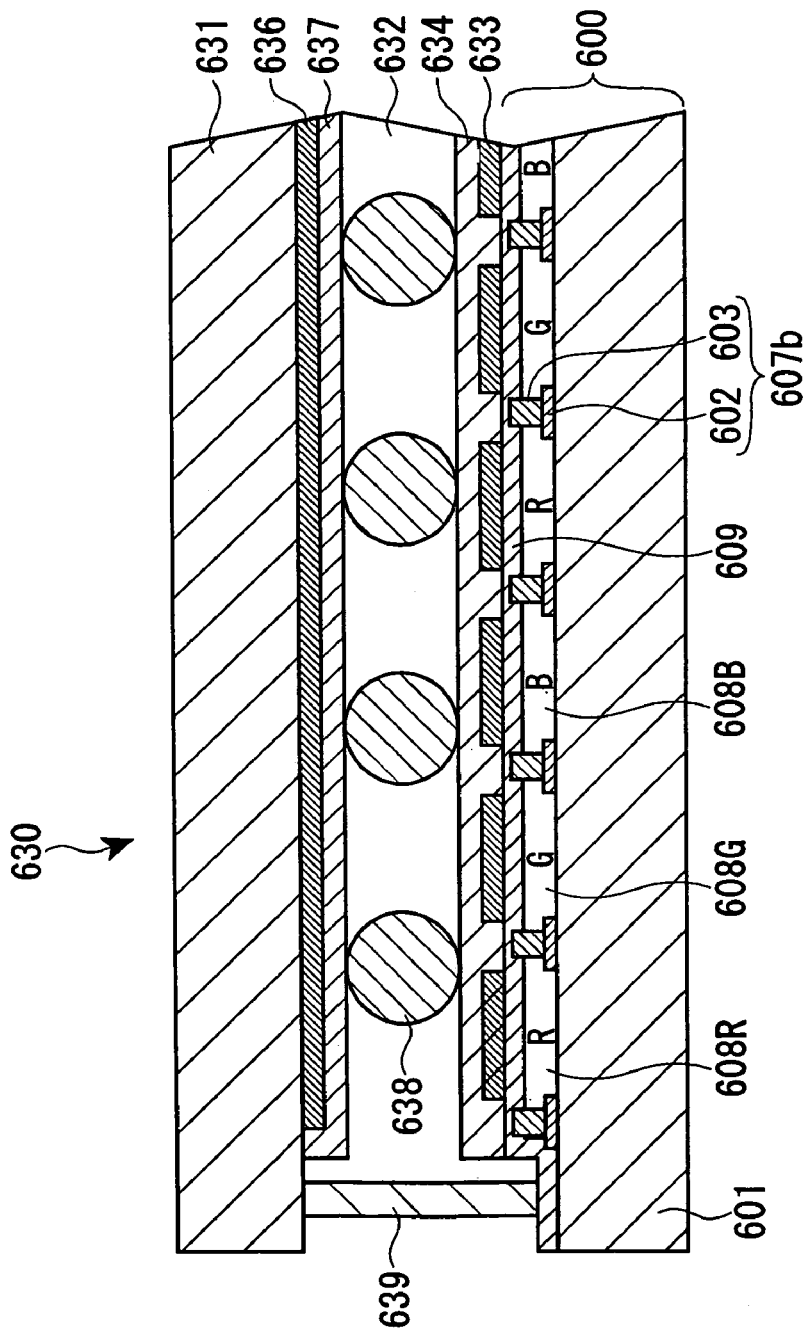
FIG. 14 is a cross-sectional view of an essential part of a second example of the liquid crystal device including a color filter according to an embodiment of the invention.

FIG. 14 is a schematic cross-sectional view of an essential part of the structure of a liquid crystal device 630, which is a second example of the liquid crystal device using the color filter 600 according to this embodiment.

One of the main differences between the liquid crystal device 630 and the above-described liquid crystal device 620 is that the color filter 600 is disposed at the lower side of the drawing (opposite to an observer).

The liquid crystal device 630 includes the color filter 600, an opposite substrate 631 formed from, for example, a glass substrate, a liquid crystal layer 632 formed from STN liquid crystal and disposed between the color filter 600 and the opposite substrate 631. Although not shown, a polarizer is disposed on each of the outer surfaces of the opposite substrate 631 and the color filter 600.

A plurality of evenly spaced long rectangular first electrodes 633 are formed on the surface of the overcoat 609 of the color filter 600 (adjacent to the liquid crystal layer 632) while extending in a direction perpendicular to the plane of FIG. 14. A first alignment layer 634 is formed to cover the surfaces of the first electrodes 633 adjacent to the liquid crystal layer 632.

A plurality of evenly spaced long rectangular second electrodes 636 are formed on the surface of the opposite substrate 631 facing the color filter 600 while extending in a direction perpendicular to the first electrodes 633 of the color filter 600. A second alignment layer 637 is formed to cover the surfaces of the second electrodes 636 adjacent to the liquid crystal layer 632.

Spacers 638 are disposed in the liquid crystal layer 632 to maintain the thickness of the liquid crystal layer 632 to be constant. A seal 639 in the liquid crystal layer 632 prevents a liquid crystal composition in the liquid crystal layer 632 from leaking to the outside. Like the above-described liquid crystal device 620, areas where the first electrodes 633 intersect the second electrodes 636 serve as pixels. The liquid crystal device 630 is designed so that the coloring layers 608R, 608G, and 608B of the color filter 600 are positioned at these areas.

FIG. 15 is a schematic exploded perspective view of a transmissive thin-film transistor (TFT) liquid crystal device, which is a third example of the liquid crystal display device using the color filter 600 according to the invention.

A liquid crystal display device 650 includes the color filter 600 at the upper side of FIG. 15 (adjacent to an observer).

The liquid crystal device 650 includes the color filter 600, an opposite substrate 651 opposed to the color filter 600, a liquid crystal layer (not shown) sandwiched by the color filter 600 and the opposite substrate 651, a polarizer 655 disposed on the upper surface of the color filter 600 (adjacent to an observer), and a polarizer (not shown) disposed on the lower surface of the opposite substrate 651.

A liquid crystal driving electrode 656 is formed on a surface of the overcoat 609 of the color filter 600 (on the surface adjacent to the opposite substrate 651). The electrode 656 is composed of a transparent conductive material, such as ITO. The electrode 656 covers the entire area in which pixel electrodes 660, which is described below, are formed. An alignment layer 657 is formed to cover the surface of the electrode 656 remote from the pixel electrode 660.

An insulating layer 658 is formed on the surface of the opposite substrate 651 remote from the color filter 600. Scanning lines 661 and signal lines 662 are formed on the insulating layer 658 while being perpendicular to each other. The pixel electrodes 660 are formed in areas surrounded by the scanning lines 661 and the signal lines 662. Although an alignment layer is formed on the pixel electrodes 660 in an actual liquid crystal device, the alignment layer is not shown here.

A thin-film transistor 663 including a source electrode, a drain electrode, a semiconductor, and a gate electrode is formed in an area surrounded by a notch portion of each of the pixel electrodes 660, the scanning line 661, and the signal line 662. By supplying signals to the scanning line 661 and the signal line 662, the thin-film transistor 663 is turned on and off to control an electrical current supplied to the pixel electrode 660.

In the above-described examples, the liquid crystal devices 620, 630, and 650 are of a transmissive type. However, by providing a reflective layer or a semi-transmissive reflective layer to these liquid crystal devices, transmissive liquid crystal devices or semi-transmissive reflective liquid crystal devices can be produced.

Figure 16:
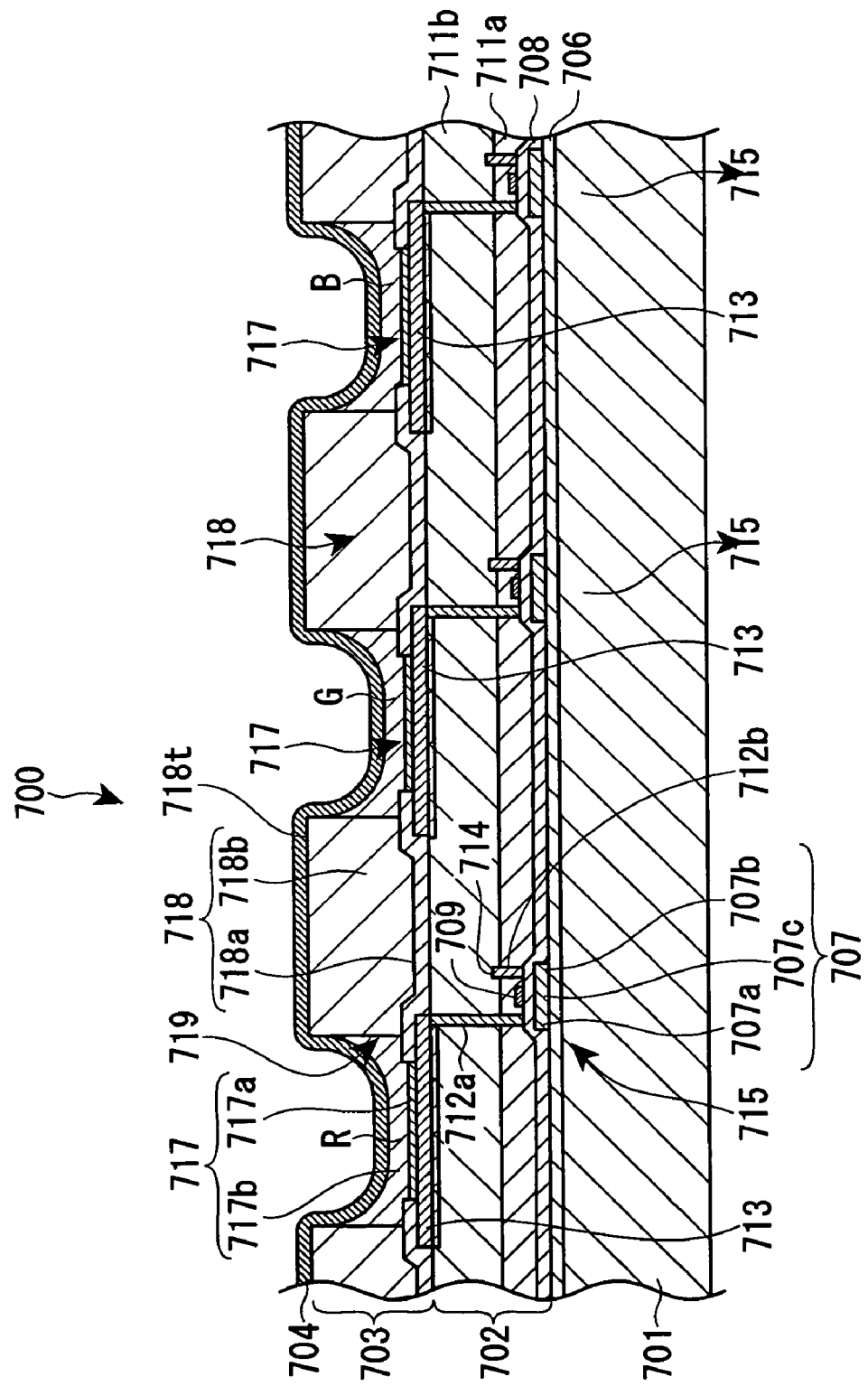
FIG. 16 is a cross-sectional view of an essential part of an organic EL display device.

FIG. 16 is a cross-sectional view of an essential part of the display area of an organic EL display (hereinafter simply referred to as a display device 700).

The display device 700 includes a substrate (W) 701, a circuit element portion 702, a light-emitting element portion 703, and a negative electrode 704, which are layered in this order.

In the display device 700, light emitted from the light-emitting element portion 703 to the substrate 701 passes through the circuit element portion 702 and the substrate 701 and is output to an observer. At the same time, light emitted from the light-emitting element portion 703 to the side remote from the substrate 701 is reflected by the negative electrode 704. The reflected light passes through the circuit element portion 702 and the substrate 701 and is output to the observer.

A bedding overcoat 706 is formed between the circuit element portion 702 and the substrate 701. The bedding overcoat 706 is composed of a silicon dioxide film. Semiconductor films 707 are formed on a surface of the bedding overcoat 706 adjacent to the light-emitting element portion 703 in island forms. The semiconductor films 707 are composed of polycrystalline silicon. A source region 707a and a drain region 707b are formed on the left and right sides of the semiconductor films 707, respectively, by high-concentration positive-ion implantation. The middle region where positive ions are not implanted defines a channel region 707c.

A transparent gate insulating film 708 is formed in the circuit element portion 702 while covering the bedding overcoat 706 and the semiconductor films 707. Gate electrodes 709 are formed on the gate insulating film 708 at positions corresponding to the channel regions 707c of the semiconductor films 707. The gate electrodes 709 are composed of, for example, Al, Mo, Ta, Ti, and W. A first transparent insulating interlayer 711a and a second insulating interlayer 711b are formed on the gate electrodes 709 and the gate insulating film 708. Contact holes 712a and 712b are formed while passing through the first and second transparent insulating interlayers 711a and 711b and communicating with the source region 707a and the drain region 707b, respectively.

Transparent pixel electrodes 713 are formed on the second insulating interlayer 711b by patterning it with a predetermined shape. The transparent pixel electrodes 713 are composed of, for example, ITO. The pixel electrodes 713 are connected to the source regions 707a via the contact holes 712a.

Power supply lines 714 are formed on the first transparent insulating interlayer 711a. Each of the power supply lines 714 is connected to the drain region 707b via the contact hole 712b.

Thus, in the circuit element portion 702, driving thin-film transistors 715 are formed and are connected to the pixel electrodes 713.

The light-emitting element portion 703 includes a function layer 717 layered on each of a plurality of the pixel electrodes 713 and a bank 718 which is disposed between each of the pixel electrodes 713 and the function layer 717 and which separates the function layer 717 from another one.

A light-emitting element includes the pixel electrodes 713, the function layer 717, and the negative electrode 704 disposed on the function layer 717. The pixel electrode 713 is formed in a substantially rectangular shape in plan view. The bank 718 is formed between the pixel electrodes 713.

The bank 718 includes an inorganic bank layer (a first bank layer) 718a and an organic bank layer (a second bank layer) 718b layered on the inorganic bank layer 718a and having a trapezoidal shape in cross section. The inorganic bank layer 718a is composed of an inorganic material, such as SiO, $SiO_2$, or $TiO_2$. The organic bank layer 718b is composed of a resist having high heat resistance and solvent resistance, such as an acrylic resin or a polyimide resin. A part of the bank 718 is formed to cover the periphery of the pixel electrode 713.

Between the banks 718, an opening 719 is formed. The size of the opening 719 gradually increases upwards towards the pixel electrodes 713.

The function layer 717 is formed in the opening 719. The function layer 717 includes a hole-injecting/hole-transporting layer 717a layered on the pixel electrode 713 and a light-emitting layer 717b formed on the hole-injecting/hole-transporting layer 717a. Another function layer may be formed next to the light-emitting layer 717b. For example, an electron-transporting layer may be formed next to the light-emitting layer 717b.

The hole-injecting/hole-transporting layer 717a has a function to transport a hole from the pixel electrode 713 to inject it into the light-emitting layer 717b. The hole-injecting/hole-transporting layer 717a is formed by ejecting a first composition (functional liquid) containing a material for forming a hole-injecting/hole-transporting layer. A widely known material can be used as the material for forming a hole-injecting/hole-transporting layer.

The light-emitting layer 717b emits light having one of the R, G, and B color components. The light-emitting layer 717b is formed by ejecting a second composition (functional liquid) containing a material for forming a light-emitting layer (a light-emitting material). A widely known material insoluble in the hole-injecting/hole-transporting layer 717a is preferably used as a solvent of the second composition (nonpolar solvent). By using such a nonpolar solvent as the second composition for the light-emitting layer 717b, the solvent does not dissolve the hole-injecting/hole-transporting layer 717a again so as to form the light-emitting layer 717b.

Thus, the light-emitting layer 717b allows a hole injected from the hole-injecting/hole-transporting layer 717a and an electron injected from the negative electrode 704 to unite and emit light.

The negative electrode 704 is formed to cover the entire surface of the light-emitting element portion 703. The negative electrode 704 allows an electrical current to flow in the function layer 717 in cooperation with the pixel electrode 713. A seal material (not shown) is disposed on the negative electrode 704.

The manufacturing process of the above-described display device 700 is described with reference to FIGS. 17 through 25.

Figure 17:
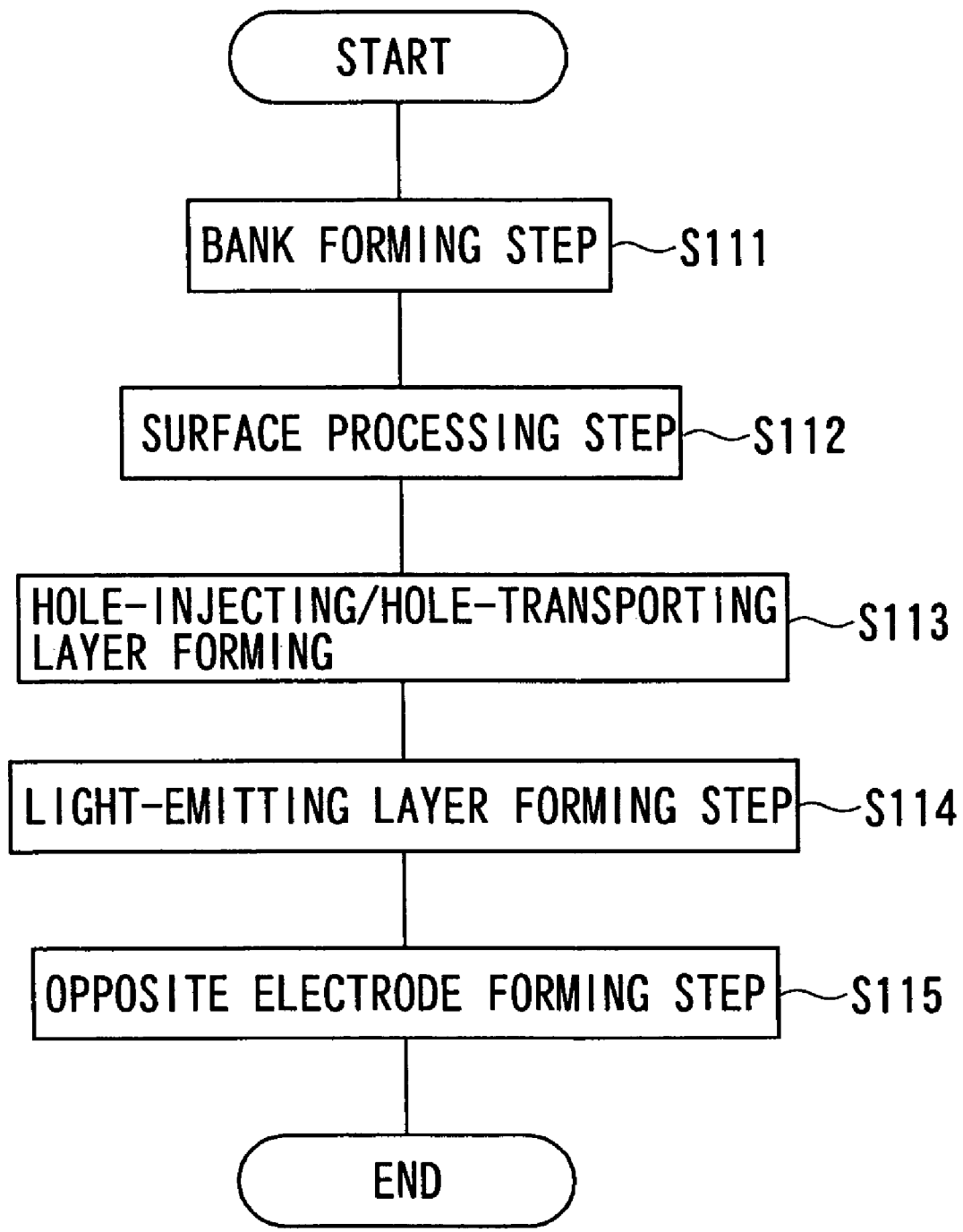
FIG. 17 is a flow chart illustrating the manufacturing steps of the organic EL display device.

As shown in FIG. 17, the manufacturing process of the display device 700 includes a bank forming step (S111), a surface processing step (S112), a hole-injecting/hole-transporting layer forming step (S113), a light-emitting layer forming step (S114), and an opposite electrode forming step (S115). The manufacturing process is not limited to the above-described steps. Some steps may be eliminated or some steps may be added.

Figure 18:
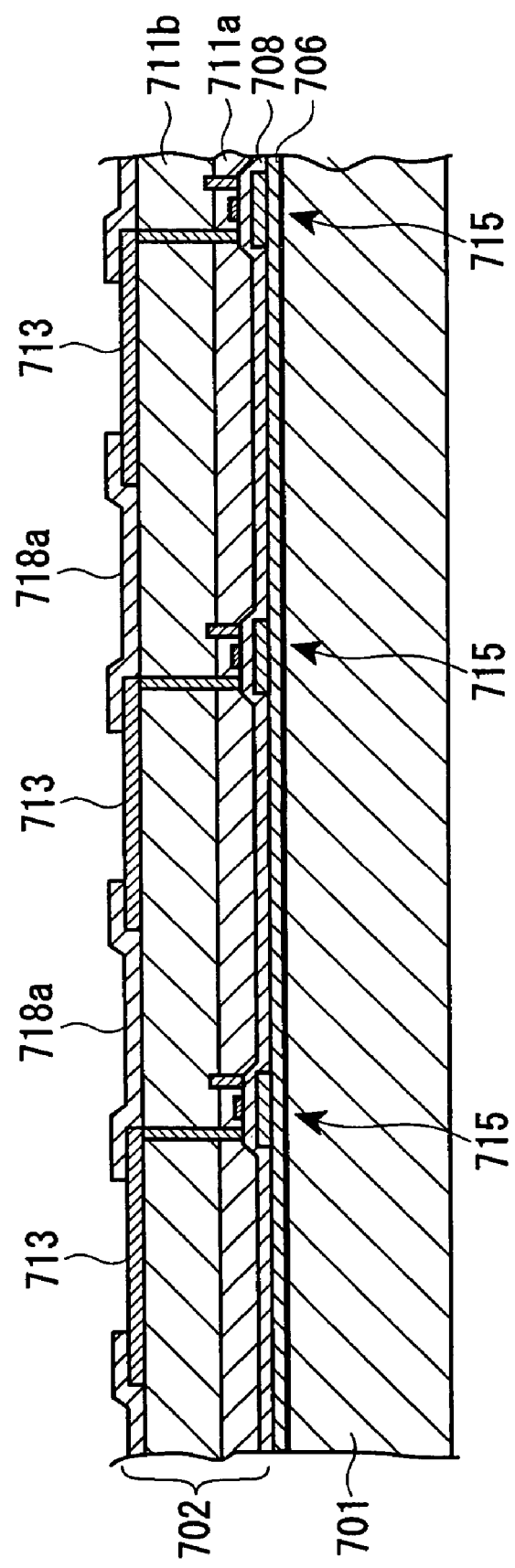
FIG. 18 illustrates a step for forming an inorganic bank layer.

In the bank forming step (S111), as shown in FIG. 18, the inorganic bank layer 718a is formed on the second insulating interlayer 711b. After an inorganic film is formed on the second insulating interlayer 711b at a desired position, the inorganic film is patterned by using a photolithography technique to form the inorganic bank layer 718a. At that time, the inorganic bank layer 718a partially overlaps the periphery of the pixel electrode 713.

Figure 19:
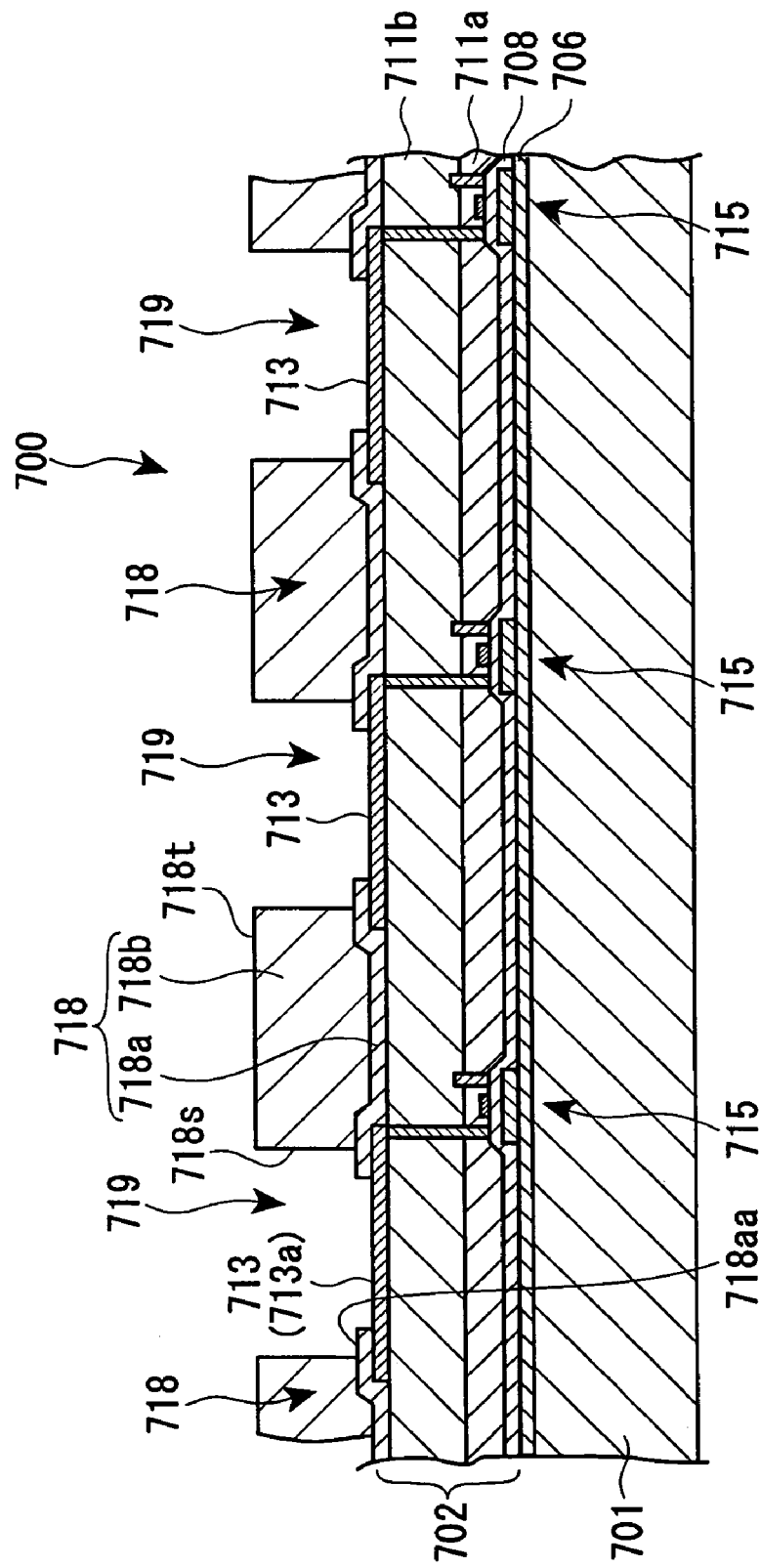
FIG. 19 illustrates a step for forming an organic bank layer.

After the inorganic bank layer 718a is formed, the organic bank layer 718b is formed on the inorganic bank layer 718a, as shown in FIG. 19. Like the inorganic bank layer 718a, the organic bank layer 718b is formed by patterning using a photolithography technique.

Thus, the bank 718 is formed. At the same time, the opening 719 which is open above the pixel electrode 713 is formed between the banks 718. This opening 719 defines the pixel area.

In surface processing step (S112), a liquid affinity treatment and a liquid repellency treatment are performed. The liquid affinity is provided to areas of a first layer 718aa of the inorganic bank layer 718a and an electrode surface 713a of the pixel electrode 713. The liquid affinity is provided to these areas (surfaces) by, for example, a plasma process using oxygen as processing gas. The plasma process also cleans ITO of the pixel electrode 713.

The liquid repellency is provided to a wall surface 718s and a top surface 718t of the organic bank layer 718b. The surfaces are treated with fluorine to have liquid repellency by, for example, a plasma process using tetrafluoromethane as processing gas.

This surface processing step results in reliable ejection of functional liquid onto a pixel area when the function layer 717 is formed by using the functional liquid droplet ejection heads 82. Additionally, the functional liquid ejected onto the pixel area can be prevented from leaking from the opening 719.

The above-described steps achieve a liquid crystal device base 700A. The liquid crystal device base 700A is mounted on the set table 21 shown in FIG. 1. Thereafter, the subsequent hole-injecting/hole-transporting layer forming step (S113) and light-emitting layer forming step (S114) are carried out.

Figure 20:
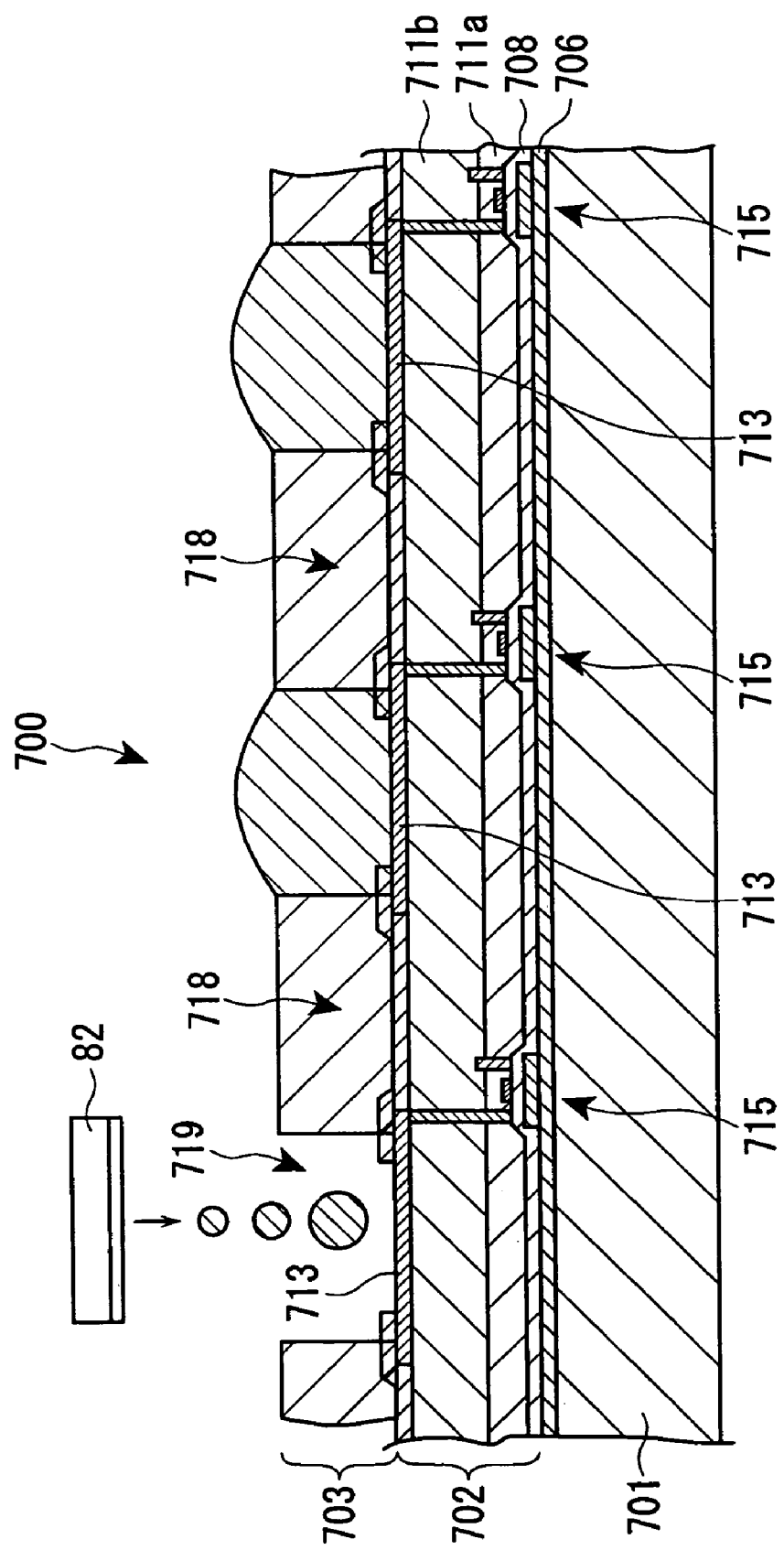
FIG. 20 illustrates a step for forming a hole-injecting/hole-transporting layer.
Figure 21:
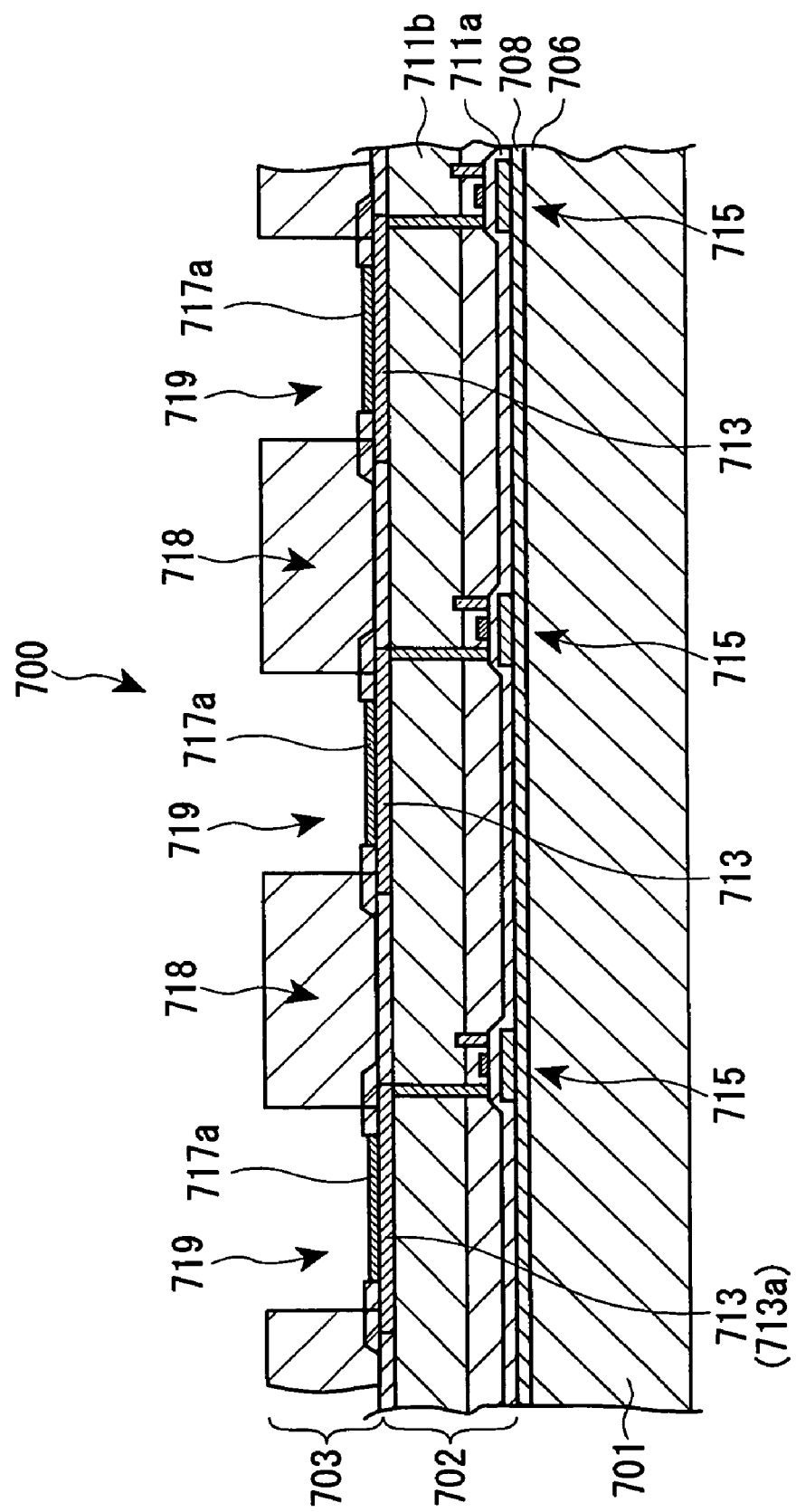
FIG. 21 illustrates a state after forming the hole-injecting/hole-transporting layer.

As shown in FIG. 20, in the hole-injecting/hole-transporting layer forming step (S113), the functional liquid droplet ejection heads 82 eject the first composition containing the material for forming the hole-injecting/hole-transporting layer into the openings 719, which are the pixel areas. Thereafter, as shown in FIG. 21, polar solvent contained in the first composition is vaporized by a drying process and a heating process to form the hole-injecting/hole-transporting layer 717a on the pixel electrode 713 (the electrode surface 713a).

The light-emitting layer forming step (S114) is described next. As described above, in this light-emitting layer forming step, to prevent re-dissolution of the hole-injecting/hole-transporting layer 717a, a nonpolar solvent insoluble to the hole-injecting/hole-transporting layer 717a is used as the solvent of the second composition.

On the other hand, since the hole-injecting/hole-transporting layer 717a has low affinity with the nonpolar solvent, there is a possibility that the hole-injecting/hole-transporting layer 717a is not brought into tight contact with the light-emitting layer 717b or the light-emitting layer 717b is not uniformly applied even though the second composition containing the nonpolar solvent is ejected to the hole-injecting/hole-transporting layer 717a.

Accordingly, to increase the affinity of the surface of the hole-injecting/hole-transporting layer 717a with the nonpolar solvent and the material forming the light-emitting layer, the surface treatment process (surface reforming process) is preferably carried out before the light-emitting layer is formed. In this surface treatment process, the same solvent as the nonpolar solvent of the second composition, which is used for forming the light-emitting layer, or a similar solvent is applied to the surface of the hole-injecting/hole-transporting layer 717a as a surface reforming material. The solvent is then dried out.

This process allows the surface of the hole-injecting/hole-transporting layer 717a to have high affinity with the nonpolar solvent, and therefore, the second composition containing a material for forming the light-emitting layer can be uniformly applied to the hole-injecting/hole-transporting layer 717a in the subsequent step.

Figure 22:
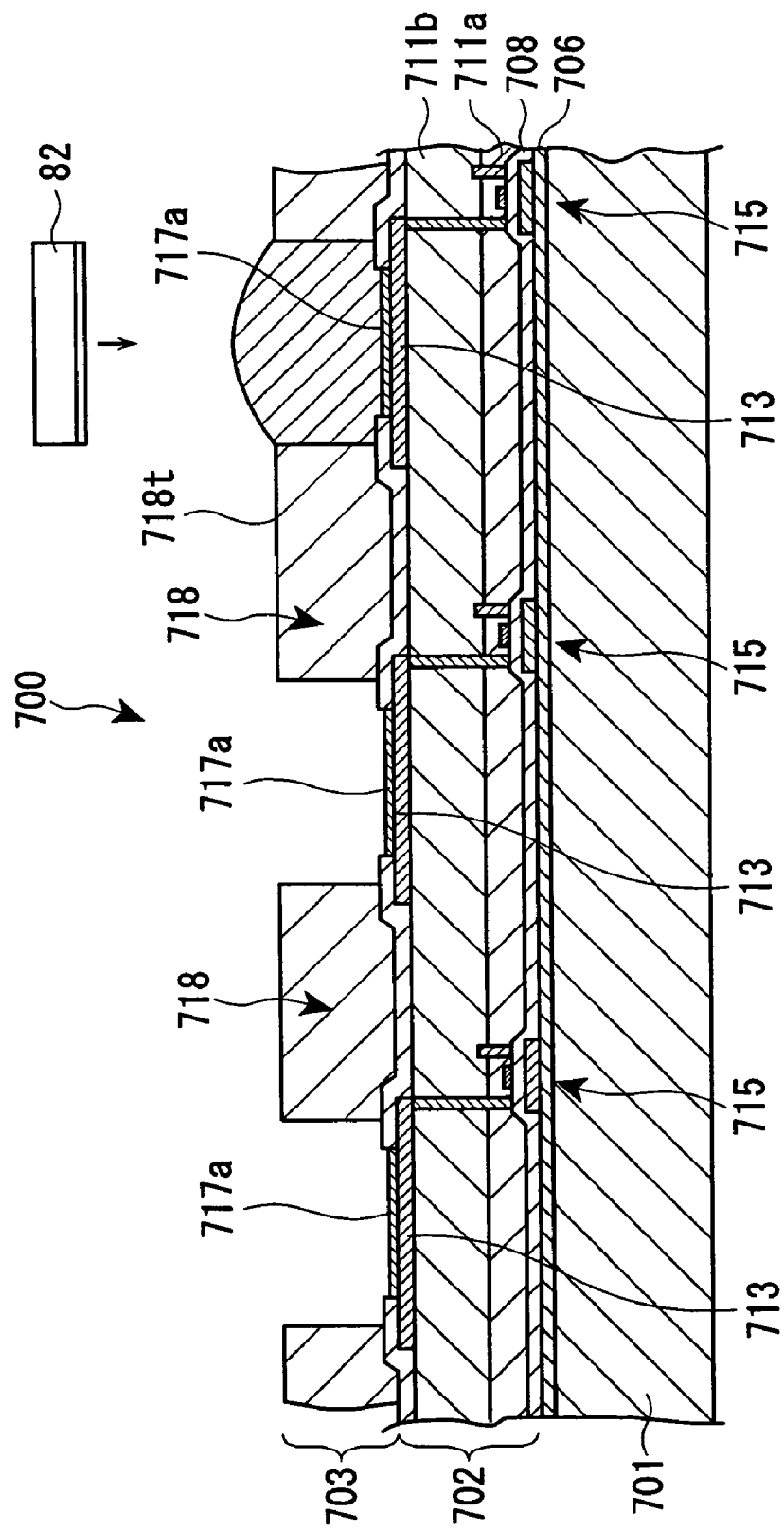
FIG. 22 illustrates a step for forming a blue light-emitting layer.

As shown in FIG. 22, a predetermined amount of the second composition containing a material for forming the light-emitting layer corresponding to one of the three colors (blue (B) in the example in FIG. 22) is ejected to the pixel area (the opening 719) as functional liquid. The second composition ejected into the pixel area spreads over the hole-injecting/hole-transporting layer 717a. The opening 719 is filled with the second composition. Even when the second composition is ejected onto the top surface 718t of the bank 718 outside the pixel area, the second composition easily moves into the opening 719 since the liquid repellency is provided to the top surface 718t, as described above.

Figure 23:
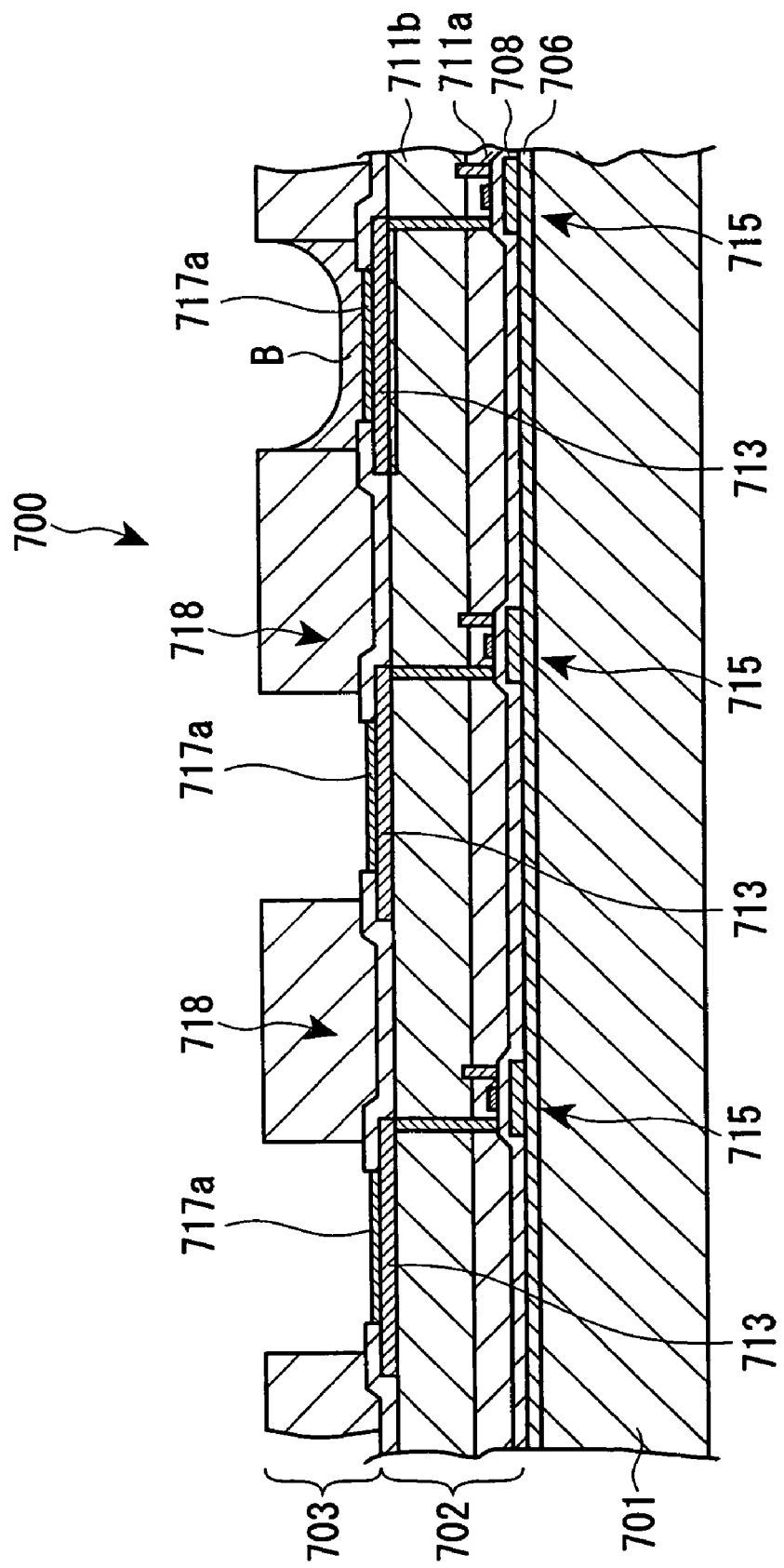
FIG. 23 illustrates a state after forming the blue light-emitting layer.

Thereafter, the drying step is carried out to dry the ejected second composition. The nonpolar solvent contained in the second composition is vaporized to form the light-emitting layer 717b on the hole-injecting/hole-transporting layer 717a, as shown in FIG. 23. In FIG. 23, the light-emitting layer 717b corresponding to blue (B) color is formed.

Figure 24:
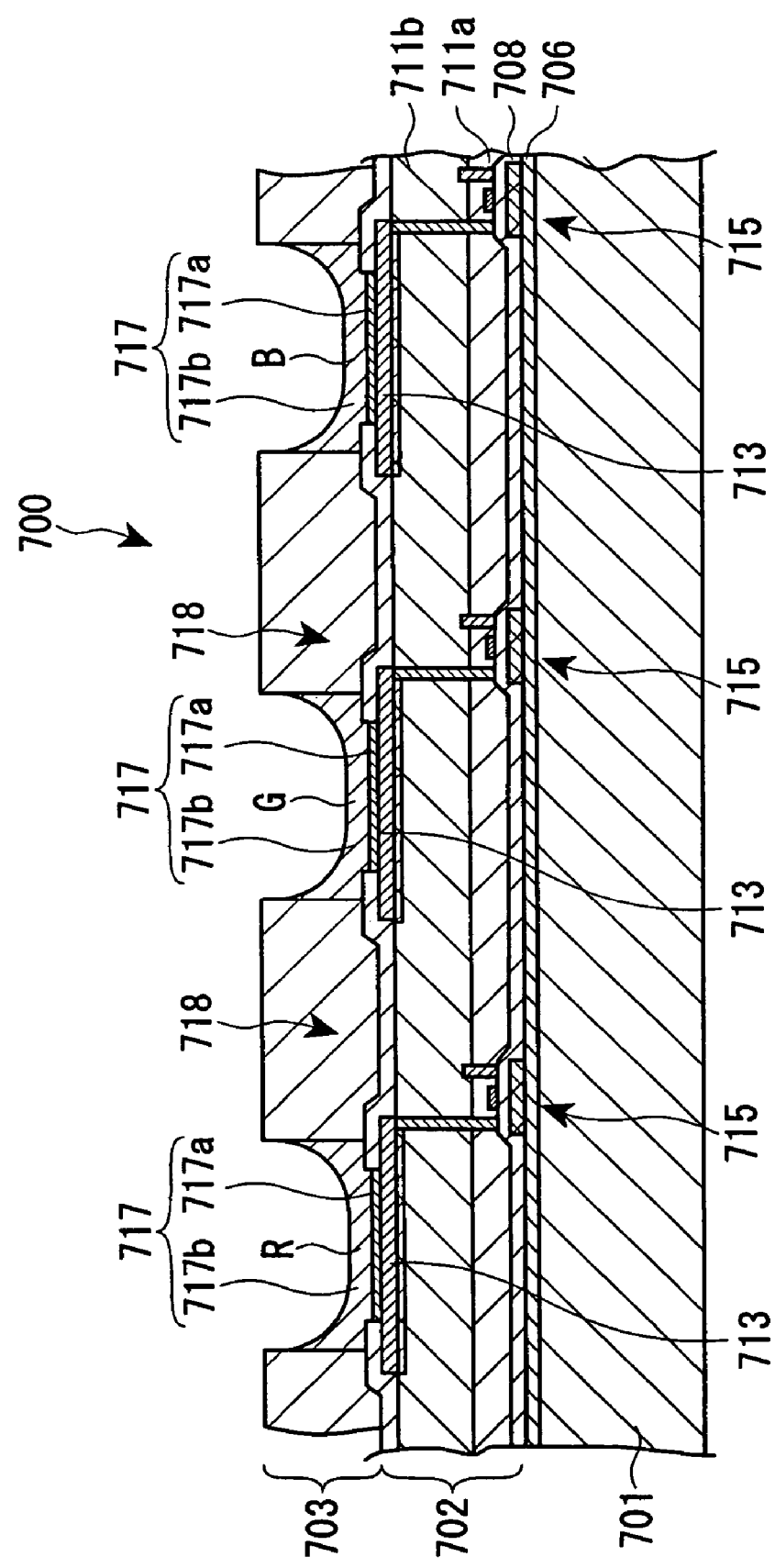
FIG. 24 illustrates a state after forming light-emitting layers for three color components.

Similarly, as shown in FIG. 24, by using the functional liquid droplet ejection heads 82, steps that are the same as those for the above-described light-emitting layer 717b corresponding to blue (B) color are sequentially carried out so as to form the light-emitting layers 717b corresponding to the other colors (red (R) and green (G)). The order of forming the light-emitting layer 717b is not limited to the above-described order. The light-emitting layers 717b may be formed in any order. For example, the order of forming can be determined depending on a material for forming the light-emitting layer. In addition, the array pattern for R, G, and B colors includes a stripe arrangement, a mosaic arrangement, and a delta arrangement.

Thus, the function layer 717, namely, the hole-injecting/hole-transporting layer 717a and the light-emitting layer 717b are formed on the pixel electrode 713. Thereafter, the opposite electrode forming step (S115) is carried out.

Figure 25:
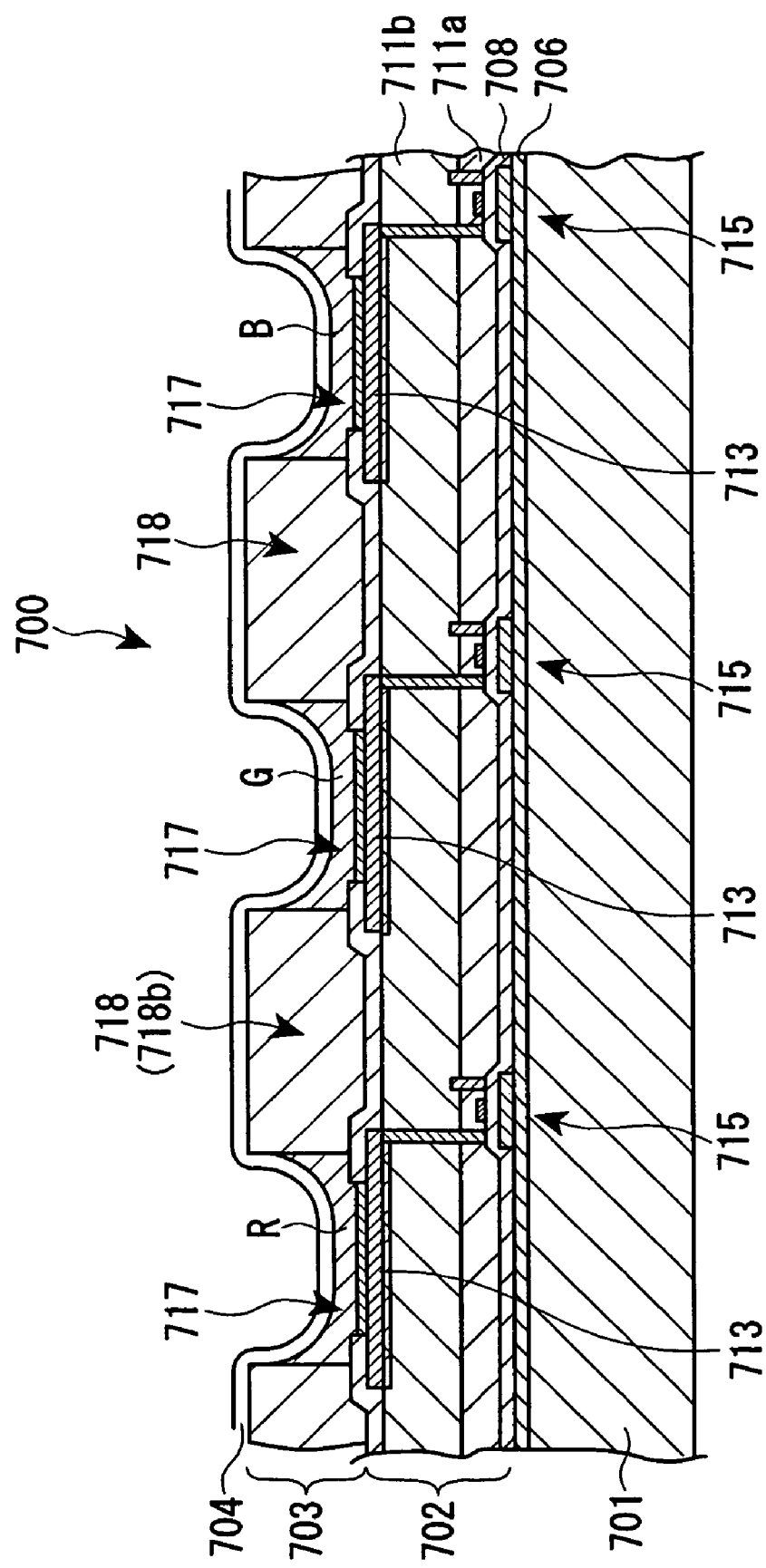
FIG. 25 illustrates a step for forming a negative electrode.

In the opposite electrode forming step (S115), as shown in FIG. 25, the negative electrode 704 (opposite electrode) is formed over the entire surfaces of the light-emitting layer 717b and the organic bank layer 718b by, for example, a vapor deposition method, a sputtering method, or a chemical vapor deposition (CVD) method. In this embodiment, the negative electrode 704 includes, for example, a laminate of a calcium layer and an aluminum layer.

An Al film or an Ag film serving as an electrode is formed on the negative electrode 704 as needed. An overcoat composed of, for example, $SiO_2$ or SiN is also formed on the Al film or the Ag film to protect it from oxidization as needed.

After the negative electrode 704 is formed, a sealing process in which the top surface of the negative electrode 704 is sealed with a sealing member and other processes, such as a wiring process, are carried out to achieve the display device 700.

Figure 26:
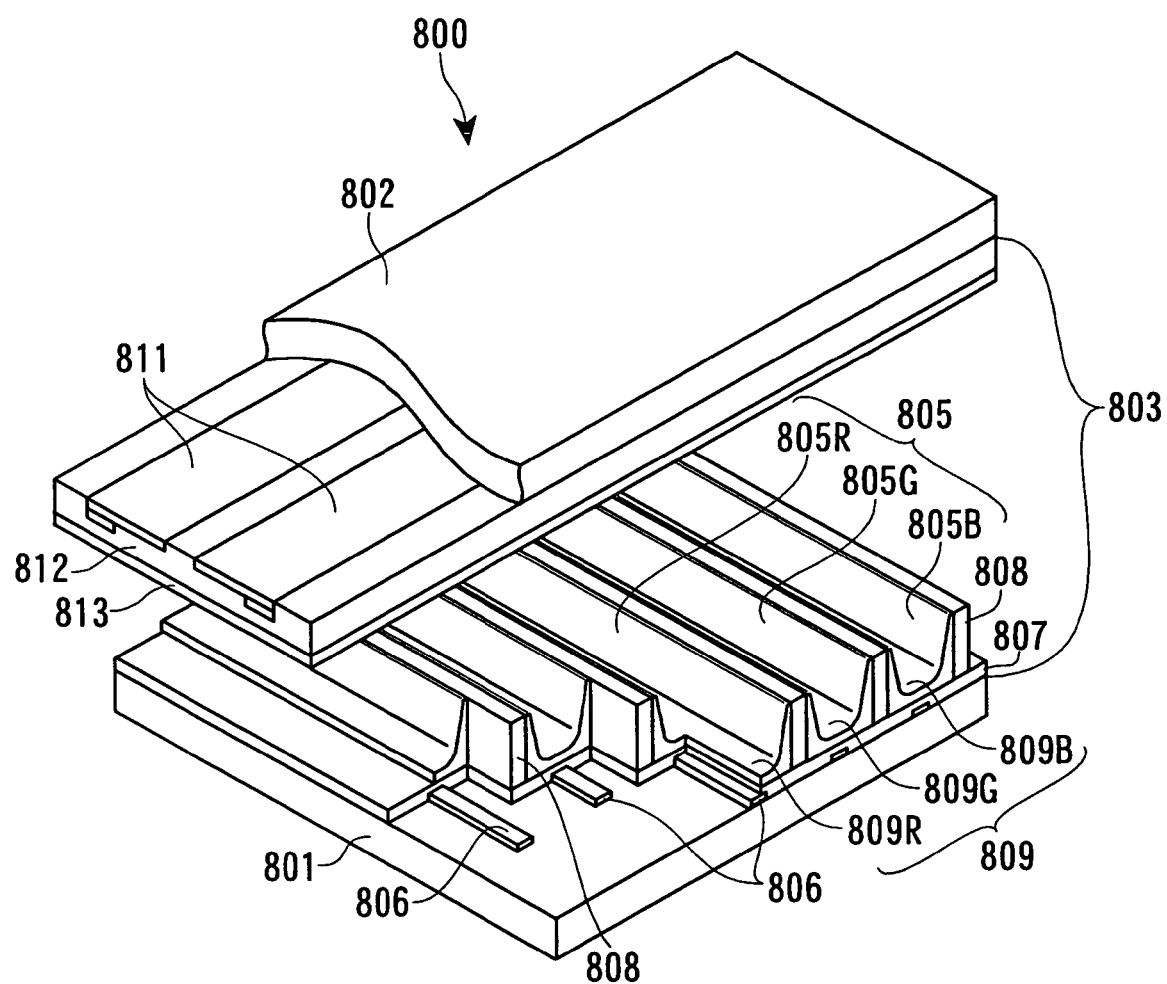
FIG. 26 is an exploded perspective view of an essential part of a plasma display device (PDP device)

FIG. 26 is an exploded perspective view of an essential part of a plasma display device (PDP device: hereinafter simply referred to as a display device 800). In this drawing, the display device 800 is partially cut away.

The display device 800 includes a first substrate 801, a second substrate 802 opposed to the first substrate 801, and a discharge display portion 803 formed therebetween. The discharge display portion 803 includes a plurality of discharge chambers 805. Among the plurality of the discharge chambers 805, a red discharge chamber 805R, a green discharge chamber 805G, and a blue discharge chamber 805B form a set serving as a pixel.

Address electrodes 806 are formed on the first substrate 801 in a stripe pattern with a predetermined spacing therebetween. A dielectric layer 807 is formed to cover the top surfaces of the address electrodes 806 and the first substrate 801. Partition walls 808 are vertically arranged on the dielectric layer 807. Each of the partition walls 808 is positioned between the address electrodes 806 while extending along the address electrodes 806. Two types of the partition walls 808 are provided: the partition walls 808 extending at both sides of the address electrode 806 in its width direction, as shown in the drawing, and the partition walls 808 extending perpendicular to the address electrodes 806 (not shown).

An area separated by the partition walls 808 serves as the discharge chamber 805.

In the discharge chamber 805, a fluorescent material 809 is arranged. The fluorescent material 809 emits fluorescent light of one of red (R), green (G), and blue (B) colors. A red fluorescent material 809R, a green fluorescent material 809G, and a blue fluorescent material 809B are disposed on the bottom surfaces of the red discharge chamber 805R, the green discharge chamber 805G, and the blue discharge chamber 805B, respectively.

As shown in FIG. 26, a plurality of display electrodes 811 are formed on the lower surface of the second substrate 802 in a stripe pattern with a predetermined spacing therebetween while extending in a direction perpendicular to the address electrodes 806. A dielectric layer 812 is formed to cover the display electrodes 811 and the second substrate 802. A overcoat 813 is formed to cover the dielectric layer 812. The overcoat 813 is made of, for example, MgO.

The first substrate 801 is bonded to the second substrate 802 so that the address electrodes 806 are perpendicular to the display electrodes 811. The address electrodes 806 and the display electrodes 811 are connected to an alternate current power supply (not shown).

By applying an electrical current to each of the address electrodes 806 and the display electrodes 811, the fluorescent material 809 in the discharge display portion 803 is excited to emit light, and therefore, a color display can be obtained.

In this embodiment, the address electrodes 806, the display electrodes 811, and the fluorescent material 809 can be produced by using the liquid droplet ejection apparatus 1 shown in FIG. 1. The steps for forming the address electrodes 806 on the first substrate 801 are described below as an example.

In this case, the first substrate 801 is mounted on the set table 21 of the liquid droplet ejection apparatus 1. Thereafter, the following steps are carried out:

The functional liquid droplet ejection heads 82 eject droplets of a liquid material (functional liquid) containing a material for forming conductive film lines onto areas where the address electrodes 806 are to be formed. The liquid material contains conductive fine particles of, for example, metal, which are dispersed in a dispersion medium and which serve as the material for forming conductive film lines. Examples of conductive fine particles include metal fine particles containing gold, silver, copper, palladium, or nickel, and a conductive polymer.

After the liquid material is supplied to all of the areas where the address electrodes 806 are to be formed, the ejected liquid material is dried so that the dispersion medium contained in the liquid material evaporates. Thus, the address electrodes 806 are formed.

In the foregoing description, the address electrodes 806 are formed. However, the same forming steps can achieve the first substrate 801 and the fluorescent material 809.

When forming the display electrodes 811, as in the step for forming the address electrodes 806, the droplets of a liquid material (functional liquid) containing a material for forming conductive film lines are ejected onto areas where the display electrodes 811 are to be formed.

When forming the fluorescent material 809, the functional liquid droplet ejection heads 82 eject the droplets of a liquid material (functional liquid) containing a fluorescent material corresponding to each color (R, G, or B) onto the discharge chamber 805 corresponding to that color.

FIG. 27 is a cross-sectional view of an essential part of an electron emission device (also referred to as an FED device or an SED device: hereinafter simply referred to as a display device 900). In this drawing, the display device 900 is partially shown in cross-section.

The display device 900 includes a first substrate 901, a second substrate 902 opposed to the first substrate 901, and a field emission display portion 903 formed therebetween. The field emission display portion 903 includes a plurality of electron emission portions 905 arranged in a matrix.

A first element electrode 906a and a second element electrode 906b, both of which form a cathode electrode 906, are formed on the first substrate 901 such that the first element electrode 906a is perpendicular to the second element electrode 906b. A conductive film 907 having a gap 908 therein is formed in an area partitioned by the first element electrode 906a and the second element electrode 906b. That is, the first element electrode 906a, the second element electrode 906b, and the conductive film 907 form a plurality of the electron emission portions 905. The conductive film 907 is made of, for example, palladium oxide (PdO). The gap 908 can be formed by a forming process after the conductive film 907 is coated.

An anode electrode 909 is formed on the lower surface of the second substrate 902 while facing the cathode electrode 906. Banks 911 are formed on the lower surface of the anode electrode 909 in a lattice. A fluorescent material 913 is disposed in each of openings 912 surrounded by the banks 911 and extending downward while facing the electron emission portion 905. The fluorescent material 913 emits fluorescent light of one of red (R), green (G), and blue (B) colors. A red fluorescent material 913R, a green fluorescent material 913G, and a blue fluorescent material 913B are disposed in the openings 912 in the above-described predetermined pattern.

The first substrate 901 having such a structure is bonded to the second substrate 902 with a small gap therebetween. In the display device 900, an electron emitted from the first element electrode 906a or the second element electrode 906b, which is a negative electrode, is hit on the fluorescent material 913 formed on the anode electrode 909, which is a positive electrode. The fluorescent material 913 is excited to emit light, and therefore, a color display can be obtained.

Like the other embodiments, the first element electrode 906a, the second element electrode 906b, the conductive film 907, and the anode electrode 909 can be produced by using the liquid droplet ejection apparatus 1. The fluorescent materials 913R, 913G, and 913B can also be produced by using the liquid droplet ejection apparatus 1.

Figure 28A:
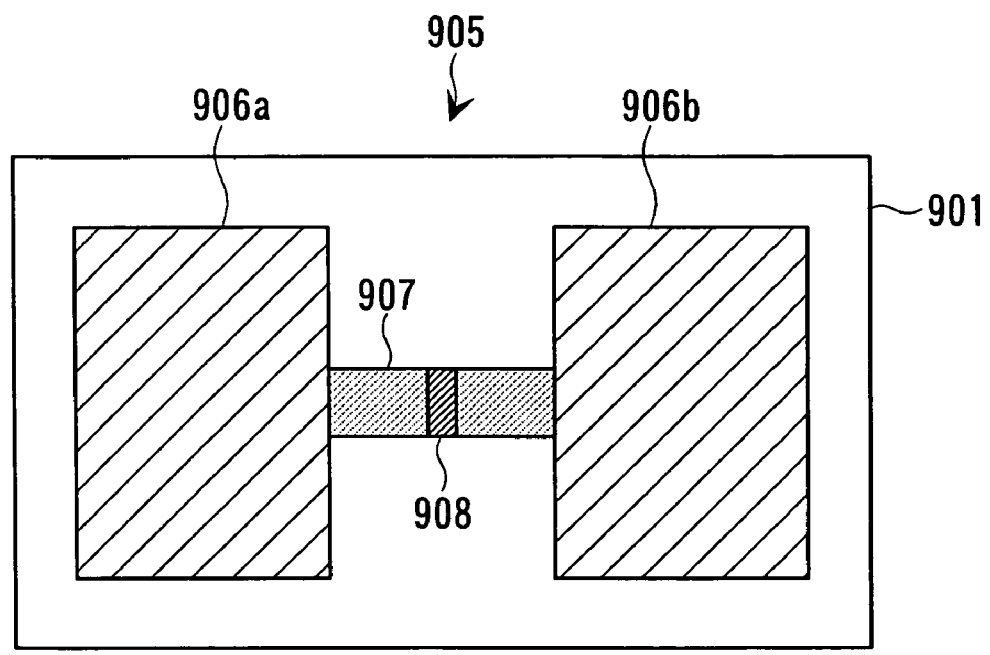
FIG. 28A is a plan view of an electron emission unit of the electron emission device.
Figure 28B:
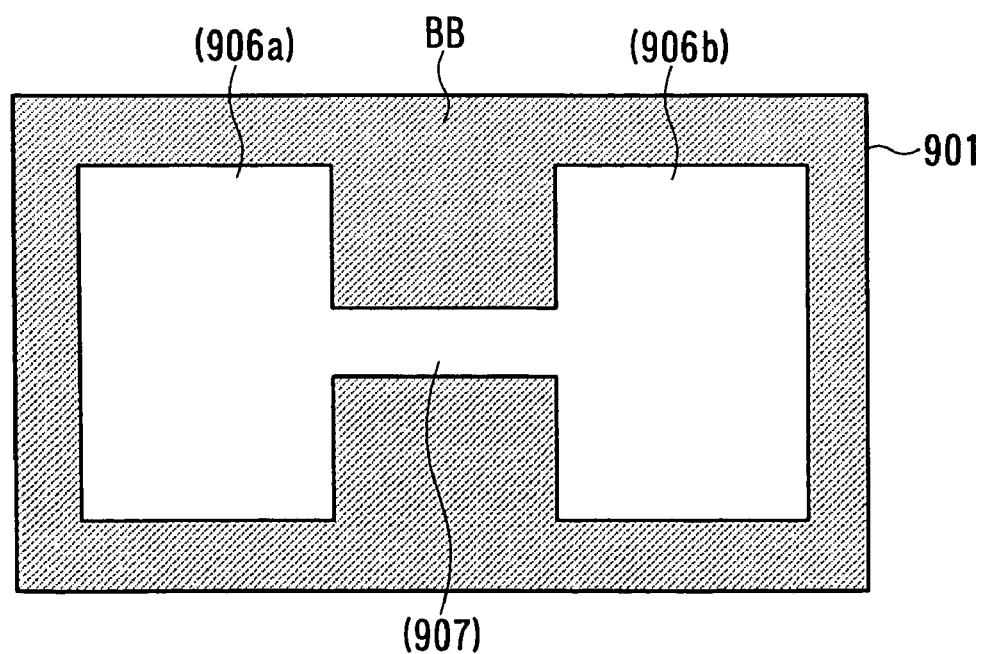
FIG. 28B is a plan view illustrating a method for forming the electron emission unit.

The first element electrode 906a, the second element electrode 906b, and the conductive film 907 have shapes shown in FIG. 28A in plan view. When these components are coated, a bank BB is formed in advance by using a photolithography method while leaving areas where the first element electrode 906a, the second element electrode 906b, and the conductive film 907 are to be formed. Thereafter, the first element electrode 906a and the second element electrode 906b are formed in grooves formed by the bank BB by an inkjet process using the liquid droplet ejection apparatus 1. The solvents of the first element electrode 906a and the second element electrode 906b are dried to coat them. The conductive film 907 is then formed by an inkjet process using the liquid droplet ejection apparatus 1. After the conductive film 907 is coated, the bank BB is removed (by a resist stripping or ashing process). The above-described forming process is then carried out. As in the step for forming the above-described organic EL device, the liquid affinity is preferably provided to the first substrate 901 and the second substrate 902, and the liquid repellency is preferably provided to the banks 911 and the bank BB.

Examples of other electro-optic devices include devices for forming metal wiring, a lens, a resist, and a light diffuser. By using the above-described liquid droplet ejection apparatus 1 for manufacturing a variety of electro-optic devices, these electro-optic devices can be efficiently manufactured.

What is claimed is:

1. A liquid droplet ejection apparatus for performing a drawing operation on a workpiece set on a set table by driving the ejection of a functional liquid droplet ejection head mounted in a head unit, the functional liquid droplet ejection head being arranged in a sub-scanning direction and including a plurality of ejection nozzles, the head unit being moved in a drawing area in a main scanning direction relative to the set table located in the drawing area by main scan moving means, the apparatus comprising:

a first flushing unit mounted on a slider body of the main scan moving means and disposed on a main scan moving axis offset from the drawing area towards the main scanning direction, the first flushing unit receiving ejection from the ejection nozzles of the functional liquid droplet ejection head during non-drawing time and moving in main scanning direction by moving the slider body in the main scanning direction; and a second flushing unit supported on a support base of the set table, the second flushing unit being disposed adjacent to the set table along an axis on which the workpiece is moved, the second flushing unit facing the drawing area, the second flushing unit receiving ejection from the ejection nozzles of the functional liquid droplet ejection head, the ejection being performed immediately before starting the drawing operation on the workpiece.

2. The apparatus according to claim 1, wherein the main scan moving means supports the set table, the first flushing unit, and the second flushing unit, and moves the set table, the first flushing unit, and the second flushing unit in the main scanning direction relative to the head unit.

3. The apparatus according to claim 2, wherein the main scan moving means comprises the slider body and supports the slider body movably in the main scanning direction, the first flushing unit and the set table are supported by the slider body.

4. The apparatus according to claim 2, wherein the main scan moving means comprises a first slider for supporting the set table movably in the main scanning direction and a second slider independently controlled from the first slider for supporting the first flushing unit movably in the main scanning direction.

5. The apparatus according to claim 1, further comprising:
control means for controlling the functional liquid droplet ejection head and the main scan moving means;
wherein the first flushing unit moves to a flushing position where the first flushing unit faces the head unit when the set table moves to a workpiece exchange position where the workpiece is mounted and dismounted and wherein the control means causes the first flushing unit to perform the ejection during an operation for mounting and dismounting the workpiece.

6. The apparatus according to claim 5, wherein the drawing operation is performed by a main scan operation that drives the ejection of the functional liquid droplet ejection head while moving the set table in the drawing area in the main scanning direction and a sub scan operation that moves the functional liquid droplet ejection head in the sub-scanning direction and wherein the length of the second flushing unit in the sub-scanning direction corresponds to a moving trajectory of the head unit in the sub scan operation.

7. The apparatus according to claim 6, wherein the length of the first flushing unit in the sub-scanning direction corresponds to a moving trajectory of the head unit in the sub scan operation.

8. The apparatus according to claim 1, further comprising:
an ejection defect test unit for detecting an ejection defect of the functional liquid droplet ejection head by recognizing an image of a test pattern written by causing the ejection nozzles of the functional liquid droplet ejection head to perform test ejection onto a drawn unit;
wherein the drawn unit is disposed at a position offset from the drawing area towards the main scanning direction and located on the main scan moving axis between the drawing area and the first flushing unit.

9. A method for manufacturing an electro-optic device comprising forming a coating portion on the workpiece with droplets of functional liquid by using the liquid droplet ejection apparatus according to claim 1.

* * * * *

UNITED STATES PATENT AND TRADEMARK OFFICE
CERTIFICATE OF CORRECTION

PATENT NO. : 7,625,064 B2  Page 1 of 1
APPLICATION NO. : 11/221227
DATED : December 1, 2009
INVENTOR(S) : Kenji Kojima It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 635 days.

Signed and Sealed this

Twenty-sixth Day of October, 2010

David J. Kappos
*Director of the United States Patent and Trademark Office*